(12) United States Patent
Shimizu et al.

(10) Patent No.: US 9,673,315 B2
(45) Date of Patent: Jun. 6, 2017

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/055,807

(22) Filed: Feb. 29, 2016

(65) Prior Publication Data

US 2016/0284834 A1    Sep. 29, 2016

(30) Foreign Application Priority Data

Mar. 24, 2015  (JP) .................................. 2015-061799
Dec. 3, 2015   (JP) .................................. 2015-236876

(51) Int. Cl.
  *H01L 29/15*    (2006.01)
  *H01L 29/78*    (2006.01)
  (Continued)

(52) U.S. Cl.
  CPC ........ *H01L 29/7802* (2013.01); *H01L 21/045* (2013.01); *H01L 21/049* (2013.01);
  (Continued)

(58) Field of Classification Search
  CPC ....... H01L 2924/00014; H01L 2924/00; H01L 29/1608; H01L 29/517; H01L 29/518
  (Continued)

(56) References Cited

U.S. PATENT DOCUMENTS 6,107,142 A   8/2000   Suvorov et al.
8,217,440 B2  7/2012   Tsuchiya
(Continued)

FOREIGN PATENT DOCUMENTS

JP  2002-518828  6/2002
JP  2011-97093   5/2011
(Continued)

OTHER PUBLICATIONS

D. J. Lichtenwalner et al. "High-Mobility SiC MOSFETs with Chemically Modified Interfaces", Materials Science Forum, vol. 821, 2014, 2 pages.

*Primary Examiner* — Andy Huynh
(74) *Attorney, Agent, or Firm* — Oblon, McClelland, Maier & Neustadt, L.L.P.

(57) ABSTRACT

A semiconductor device according to the embodiments includes a SiC layer having a first plane, an insulating layer, and a region between the first plane and the insulating layer, the region including at least one element in the group consisting of Be (beryllium), Mg (magnesium), Ca (calcium), Sr (strontium), and Ba (barium), a full width at half maximum of a concentration peak of the element being equal to or less than 1 nm, and when a first area density being an area density of Si (silicon) and C (carbon) including a bond which does not bond with any of Si and C in the SiC layer at the first plane and a second area density being an area density of the element, the second area density being equal to or less than ½ of the first area density.

19 Claims, 22 Drawing Sheets

(51) Int. Cl.
  *H01L 29/16* (2006.01)
  *H01L 29/06* (2006.01)
  *H01L 29/10* (2006.01)
  *H01L 29/04* (2006.01)
  *H01L 21/04* (2006.01)
  *H01L 29/872* (2006.01)

(52) U.S. Cl.
  CPC .......... *H01L 29/045* (2013.01); *H01L 29/063* (2013.01); *H01L 29/1095* (2013.01); *H01L 29/1608* (2013.01); *H01L 29/872* (2013.01)

(58) Field of Classification Search
  USPC .......................................................... 257/77
  See application file for complete search history.

(56) References Cited

U.S. PATENT DOCUMENTS

| | | |
|---|---|---|
| 2011/0254062 A1 | 10/2011 | Shimizu et al. |
| 2012/0326163 A1 | 12/2012 | Dhar et al. |
| 2012/0326244 A1 | 12/2012 | Suzuki et al. |
| 2015/0084068 A1 | 3/2015 | Shimizu |
| 2015/0236098 A1* | 8/2015 | Shimizu .............. H01L 29/1608 257/77 |
| 2015/0236099 A1* | 8/2015 | Shimizu .............. H01L 29/1608 257/77 |
| 2015/0303271 A1* | 10/2015 | Tanaka .................... H01L 29/78 257/77 |
| 2016/0197150 A1* | 7/2016 | Ariyoshi ........... H01L 21/02326 257/77 |

FOREIGN PATENT DOCUMENTS

| | | |
|---|---|---|
| JP | 2011-228429 | 11/2011 |
| JP | 2012-64942 | 3/2012 |
| JP | 2014-523131 | 9/2014 |
| WO | WO 2011/089647 A1 | 7/2011 |

* cited by examiner

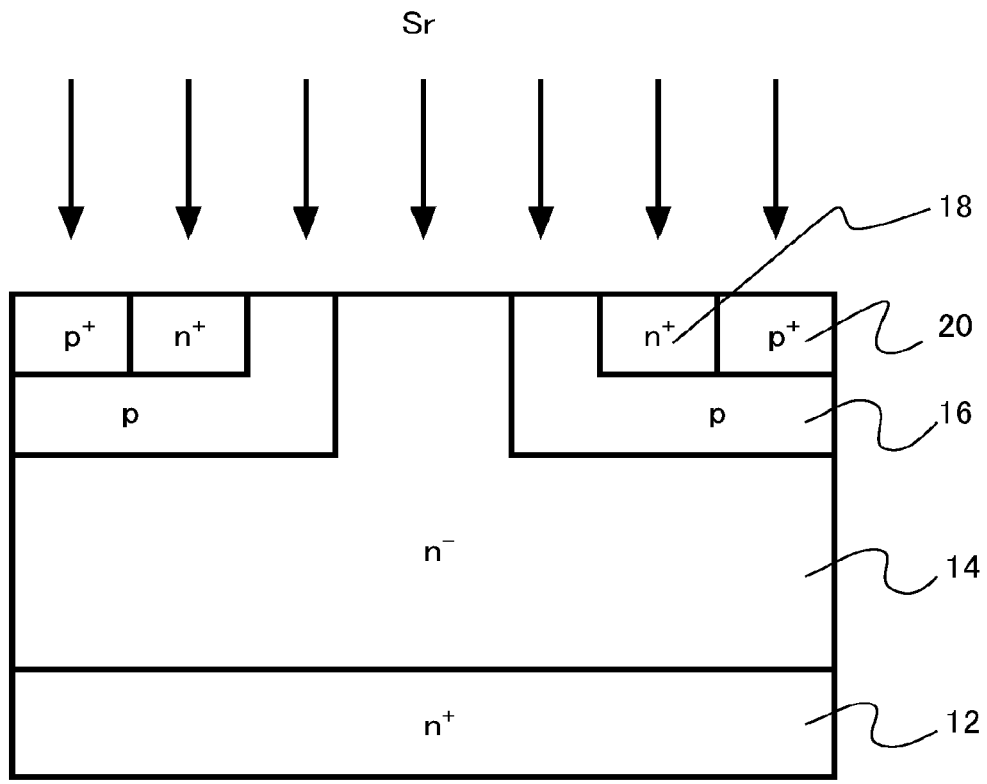
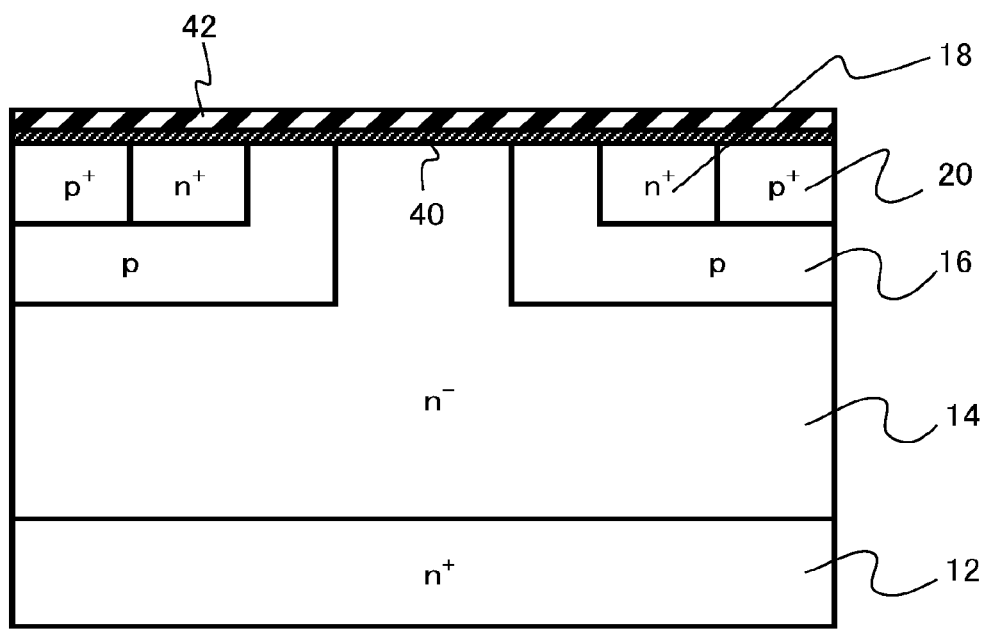

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2015-061799, filed on Mar. 24, 2015, and Japanese Patent Application No. 2015-236876, filed on Dec. 3, 2015, the entire contents of which are incorporated herein by reference.

FIELD

Embodiments described herein relate generally to a semiconductor device, an inverter circuit, a driving device, a vehicle, and an elevator.

BACKGROUND

SiC (silicon carbide) is expected as a material for a next-generation semiconductor device. SiC have excellent physical properties in comparison with Si (silicon). A band gap is three times, breakdown electric field strength is approximately ten times, and thermal conductivity is approximately three times. A low loss semiconductor device which can operate at a high temperature can be realized by using such properties.

However, for example, in the case where a metal insulator semiconductor (MIS) structure is formed by using SiC, an interface state density between a semiconductor and an insulating layer increases in comparison with a case where Si is used. Therefore, there is a problem that mobility of an electric charge is lowered, and ON-resistance of a metal insulator semiconductor field effect transistor (MISFET) and an insulated gate bipolar transistor (IGBT) is increased. Further, for example, in the case where a Schottky barrier diode (SBD) is manufactured by providing a metal electrode on SiC, fermi level pinning is caused by an interface state between the SiC and the metal electrode. Therefore, there is a problem that desired properties as an SBD cannot be realized.

BRIEF DESCRIPTION OF THE DRAWINGS

FIG. 4 is a schematic sectional view of a semiconductor device in manufacturing according to the fourth embodiment;

FIG. 5 is a schematic sectional view of a semiconductor device in manufacturing according to the fourth embodiment;

DETAILED DESCRIPTION

Figure 1:
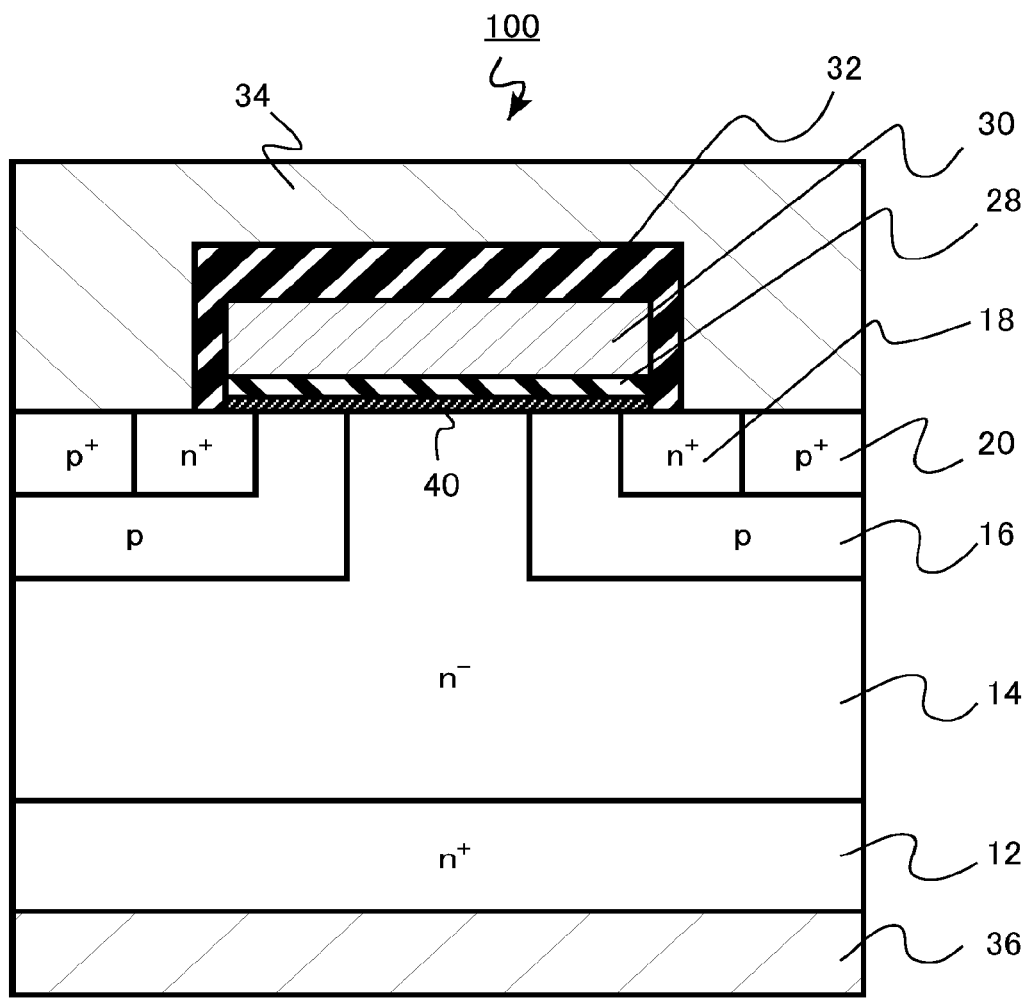
FIG. 1 is a schematic sectional view of a semiconductor device according to a first embodiment.

A semiconductor device according to embodiments described herein includes a SiC layer having a first plane, an insulating layer, and a region between the first plane and the insulating layer, the region including at least one element in the group consisting of Be (beryllium), Mg (magnesium), Ca (calcium), Sr (strontium), and Ba (barium), a full width at half maximum of a concentration peak of the element being equal to or less than 1 nm, and when a first area density being an area density of Si (silicon) and C (carbon) including a bond which does not bond with any of Si and C in the SiC layer at the first plane and a second area density being an area density of the element, the second area density being equal to or less than ½ of the first area density.

Embodiments of the present disclosure will be described below with reference to drawings. In description below, same or similar members may be denoted by same reference characters, and description of members already described will be appropriately omitted.

Further, in description below, symbols of $n^+$, n, $n^-$ and $p^+$, p, $p^-$ indicate relative height of an impurity concentration in each conduction type. Specifically, $n^+$ indicates that an impurity concentration of an n type is relatively higher than n, and $n^-$ indicates that the impurity concentration of the n type is relatively lower than n. Furthermore, $p^+$ indicates that an impurity concentration of a p type is relatively higher than p, and $p^-$ indicates that the impurity concentration of the p type is relatively lower than p. An $n^+$ type and an $n^-$ type may be simply written as an n type, and a $p^+$ type and a $p^-$ type may be simply written as a p type.

First Embodiment

A semiconductor device according to a first embodiment includes a SiC layer including a first plane, an insulating layer, and a region provided between the first plane of the SiC layer and the insulating layer. The region includes at least one element selected from the group consisting of Be (beryllium), Mg (magnesium), Ca (calcium), Sr (strontium), and Ba (barium). In the region, a full width at half maximum of a concentration peak of the element is equal to or less than 1 nm, and in a case where an area density of Si (silicon) and C (carbon) which do not bond with any of Si and C on the first plane is set to a first area density, a second area density which is an area density of the element is equal to or less than ½ of the first area density.

Hereinafter, the above region is called an interface region for convenience. Further, the element included in the interface region is called a terminate element.

FIG. 1 is a schematic sectional view illustrating a configuration of a MISFET which is a semiconductor device according to the present embodiment. A MISFET 100 is a double implantation MOSFET (DIMOSFET) which forms a p-well and a source region by ion implantation.

The MISFET 100 includes an $n^+$-type SiC substrate 12. In the present description, with respect to faces of the SiC substrate 12, a face on an upper side in FIG. 1 is called a front face, and a face on a lower side is called a back face.

The SiC substrate 12 is, for example, a SiC substrate of 4H—SiC including N (nitrogen), in which an impurity concentration is $1\times10^{18}$ cm$^{-3}$ or more and $1\times10^{20}$ cm$^{-3}$ or less, as an n-type impurity.

Figure 2:
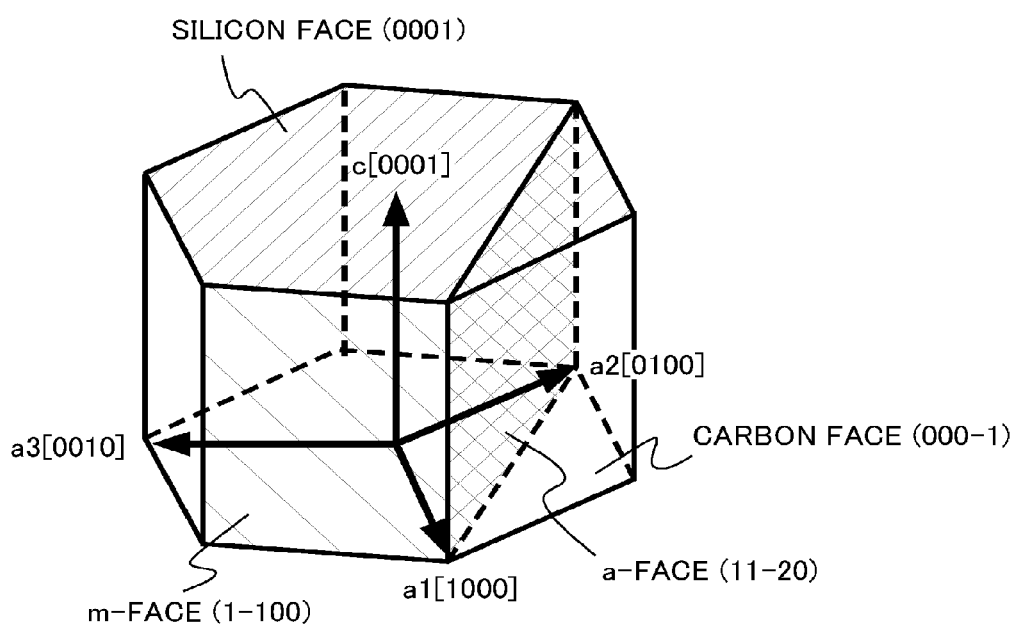
FIG. 2 illustrates a crystal structure of a SiC semiconductor according to the first embodiment.

FIG. 2 illustrates a crystal structure of a SiC semiconductor. A representative crystal structure of a SiC semiconductor is a hexagonal crystal system such as 4H—SiC. One side of faces in which a c-axis is a normal line (a top face of the hexagonal prism) is a (0001) face. Faces equivalent to the (0001) face is called a silicon face and denoted as a {0001}face. Si (silicon) is arranged on the silicon face.

The other side of faces in which the c-axis is a normal line (a top face of the hexagonal prism) is a (000-1) face. Faces equivalent to the (000-1) face is called a carbon face and denoted as a {000-1}face. C (carbon) is arranged on the carbon face.

On the other hand, side surfaces (prism surface) of a hexagonal prism are m-faces equivalent to a (1-100) face, specifically a {1-100}face. Further, faces passing through a pair of ridgelines which are not neighboring are an a-faces equivalent to a (11-20) face, specifically a {11-20}face. Both of Si (silicon) and C (carbon) are arranged on the m-faces and the a-faces.

Hereinafter, an example will be described in which a front face of the SiC substrate 12 is a face inclined at 0° or more and 30° or less with respect to a silicon face, and a back face is a face inclined at 0° or more and 30° or less with respect to a carbon face.

On the front face of the SiC substrate 12, for example, an n type drift layer (SiC layer) 14 is formed in which an impurity concentration of an n-type impurity is $5\times10^{15}$ cm$^{-3}$ or more and $2\times10^{16}$ cm$^{-3}$ or less. The drift layer 14 is, for example, an epitaxial layer of SiC formed by epitaxial growing on the SiC substrate 12.

A front face (a first plane) of the drift layer 14 is a face inclined at 0° or more and 30° or less with respect to a silicon face. A film thickness of the drift layer 14 is, for example, 5 μm or more and 100 μm or less.

On a part of the front face of the drift layer 14, for example, a p-type p-well region (SiC layer) 16 is formed in which an impurity concentration of a p-type impurity is $5\times10^{15}$ cm$^{-3}$ or more and $1\times10^{17}$ cm$^{-3}$ or less. A depth of the p-well region 16 is, for example, approximately 0.6 μm. The p-well region 16 functions as a channel region of the MISFET 100.

On a part of the front face of the p-well region 16, for example, an $n^+$-type source region 18 is formed in which an impurity concentration of an n-type impurity is $1\times10^{18}$ cm$^{-3}$ or more and $1\times10^{22}$ cm$^{-3}$ or less. A depth of the source region 18 is shallower than a depth of the p-well region 16 and, for example, approximately 0.3 μm.

Further, on a part of the front face of the p-well region 16 and on a side of the source region 18, a $p^+$-type p-well contact region 20 is formed in which an impurity concentration of a p-type impurity is $1\times10^{18}$ cm$^{-3}$ or more and $1\times10^{22}$ cm$^{-3}$ or less, for example. A depth of the p-well contact region 20 is shallower than a depth of the p-well region 16 and, for example, approximately 0.3 μm.

A gate insulating layer (insulating layer) 28 formed over the drift layer 14 and the p-well region 16 is formed continuously on front faces (first plane) of the drift layer 14 and the p-well region 16. For example, a silicon oxide film, a silicon oxynitride film, or a high-k insulating film can be used for the gate insulating layer 28. In view of suppressing a leak current of the gate insulating layer 28, a silicon oxide film in which a band gap is larger than that of a high-k insulating film is preferably used.

Further, if C (carbon) excessively exists in the gate insulating layer 28, a trap state density which adversely affects device characteristics may increase. Therefore, a C (carbon) concentration in the gate insulating layer 28 is preferably equal to or less than $1\times10^{18}$ cm$^{-3}$.

A gate electrode 30 is formed on the gate insulating layer 28. For example, doped polysilicon can be used for the gate electrode 30. On the gate electrode 30, for example, an interlayer insulating film 32 formed of a silicon oxide film is formed.

The p-well region 16 sandwiched between the source region 18 and the drift layer 14 under the gate electrode 30 functions as a channel region of the MISFET 100.

The gate insulating layer 28 is provided between the gate electrode 30 and the drift layer 14. An interface region 40 is provided between the drift layer 14 and the gate insulating layer 28.

The interface region 40 includes at least one element (termination element) selected from the group consisting of Be (beryllium), Mg (magnesium), Ca (calcium), Sr (strontium), and Ba (barium).

The termination element is segregated on an interface between the drift layer 14 and the gate insulating layer 28. A full width at half maximum of a concentration peak of the termination element is equal to or less than 1 nm. The full width at half maximum of the concentration peak is preferably equal to or less than 0.5 nm and more preferably less than 0.2 nm.

The interface region 40 is preferably a monoatomic layer.

An area density of Si (silicon) and C (carbon) which do not bond with any of Si and C on a front face (first plane) of the drift layer (SiC layer) 14 is defined as a first area density. Further, an area density of a termination element is defined as a second area density. The second area density is equal to or less than ½ of the first area density.

The second area density is preferably equal to or less than 1/120 of the first area density. Further, the second area density is preferably equal to or greater than 1/12000 of the first area density.

A concentration peak of a termination element in the interface region 40 is preferably equal to or greater than $5\times 10^{18}$ cm$^{-3}$. Further, the concentration peak is more preferably equal to or greater than $1\times 10^{19}$ cm$^{-3}$.

A concentration of a termination element in the gate insulating layer (insulating layer) 28 is preferably equal to or less than $1\times 10^{18}$ cm$^{-3}$. A concentration of a termination element in an insulating layer can be confirmed by a SIMS and is preferably equal to or less than a detection limit of each termination element (approximately $1\times 10^{17}$ cm$^{-3}$ or less). A concentration of a termination element in the gate insulating layer 28 is, for example, a concentration at a position away from 1 nm or more from a concentration peak of a termination element in the interface region 40.

The MISFET 100 includes a conductive source electrode 34 electrically connected to the source region 18 and the p-well contact region 20. The source electrode 34 functions as a p-well electrode which applies a potential to the p-well region 16.

The source electrode 34 is formed by stacking of, for example, barrier metal layers of Ni (nickel) and metal layers of Al (aluminum) on the barrier metal layers. The barrier metal layers of Ni and the metal layers of Al may form an alloy by reaction.

Further, a conductive drain electrode 36 is formed on a side opposed to the drift layer 14 on the SiC substrate 12, specifically a back surface side. The drain electrode 36 is, for example, Ni (nickel).

In the present embodiment, an n-type impurity is preferably such as N (nitrogen) and P (phosphorus). However, As (arsenic) or Sb (antimony) is applicable. Further, a p-type impurity is preferably such as Al (aluminum). However, such as B (boron), Ga (gallium), and In (indium) are applicable.

A function and an effect of a semiconductor device according to the present embodiment will be described below.

It is considered that one of reasons for not realizing high mobility in a MIS structure of SiC is that a dangling bond of Si (silicon) and C (carbon) on an interface is not terminated, and an interface state is formed. As a result of a study by a first principle calculation by inventors, it has been clarified that a dangling bond on a SiC layer surface can be stably terminated by an element (termination element) selected from the group consisting of Be (beryllium), Mg (magnesium), Ca (calcium), Sr (strontium), and Ba (barium), which are alkali earth metal.

More specifically, it has been clarified that, for example, in the case where the above element exists in a stacked structure of SiC layers and silicon oxide films, the case where the element bonds on a front face of the SiC layer with an electron exchange action between Si (silicon) or C (carbon) on the front face of the SiC layer is more energetically stable than the case where the element independently exists in the SiC layer and the silicon oxide film. Since each of the element is divalent, the element bonds on a front face of the SiC layer by exchanging electrons between two Si or C neighboring on the front face of the SiC layer. However, a process to be described later may be necessary to create a structure in which a terminate element is segregated only on a stacked interface between SiC layers and silicon oxide films.

A bonding state between the element and Si or C can be confirmed by such as an X-ray photoelectron spectroscopy (XPS) measurement.

In the present embodiment, a front face of a SiC layer is terminated by at least one element (termination element) selected from the group consisting of Be (beryllium), Mg (magnesium), Ca (calcium), Sr (strontium), and Ba (barium). Therefore, an interface state in a MIS structure is reduced, and high mobility in a channel can be realized. Accordingly, a MISFET with low ON resistance is realized.

Figure 3:
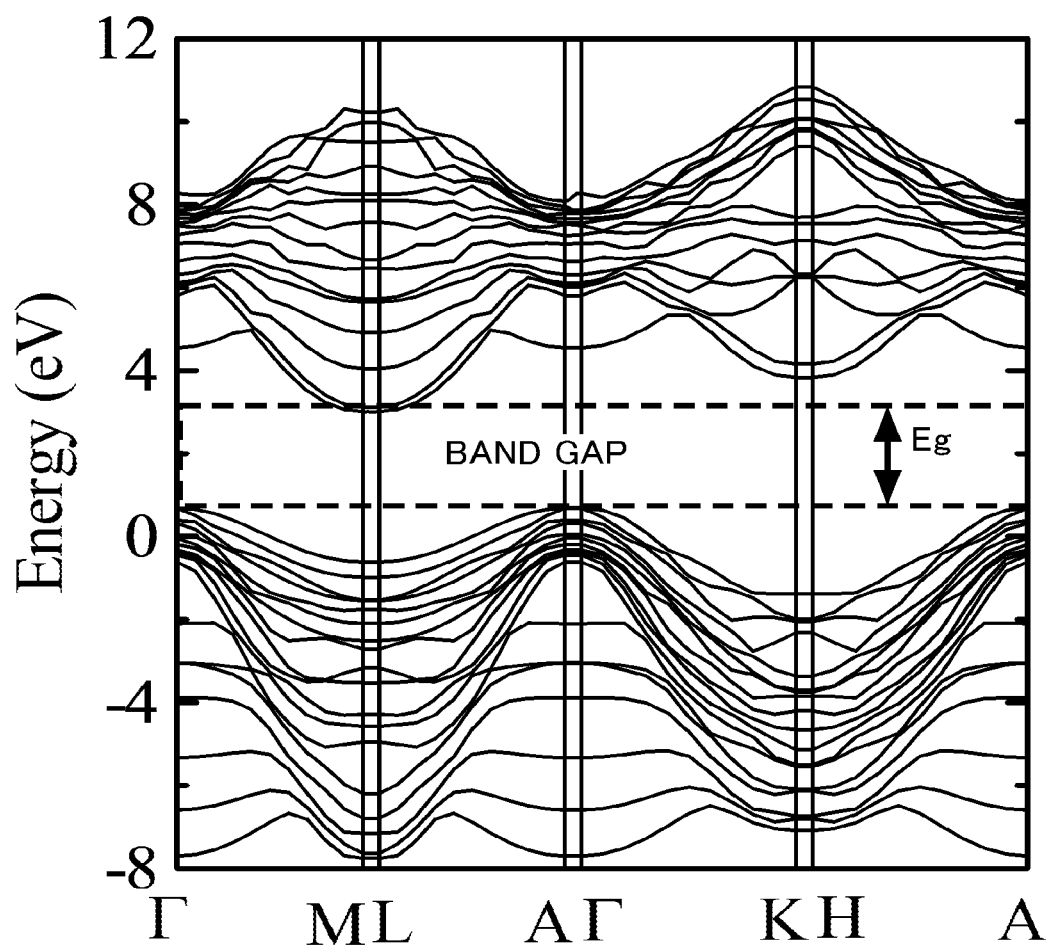
FIG. 3 is a schematic sectional diagram illustrating a semiconductor device in manufacturing according to a fourth embodiment.

FIG. 3 illustrates an example of a band diagram of the semiconductor device according to the present embodiment. The band diagram in the case where a silicon face of a SiC semiconductor is terminated by Sr (strontium) is calculated by a first principle calculation.

As illustrated in FIG. 3, a dangling bond of Si is terminated by bonding Sr to Si, and an interface state caused by the dangling bond in a midgap between a valence band and a conduction band is eliminated. A band gap energy of the SiC semiconductor recovers the band gap energy of a abulk 4H—SiC.

Further, it has been clarified by a first principle calculation that a termination element according to the present embodiment can form an energetically stable termination structure in comparison with, for example, H (hydrogen) and N (nitrogen) known which can terminate a dangling bond. Therefore, for example, a dangling bond by divergence of a termination element is hard to occur even after a high temperature process in manufacturing.

In the case where a front face of a SiC layer is oxidized, roughness on an interface between SiC and an oxide film occurs since oxygen attacks a back bond of Si, and reliability of a gate insulating layer might be lowered. Further, during oxidation, C (carbon) is dispersed in an oxide film, accordingly a leak current may increase, and reliability may decrease. Furthermore, mobility of a MISFET may be lowered since a trap state is formed since a hole of C (carbon) is formed on a SiC layer during oxidation.

According to the present embodiment, a uppermost surface on a SiC layer is terminated by the above termination element, and the stable interface region 40 is formed. If the stable interface region 40 exists, further oxidation on a SiC layer can be suppressed even if the SiC layer is exposed to an oxidizing atmosphere. Therefore, roughness on an interface and diffusion of C (carbon) in an oxide film are suppressed. Accordingly, increase in a leak current in a gate insulating layer and decrease in reliability can be prevented. Further, a hole of C (carbon) is not easily formed, and decrease in the mobility of a MISFET can be suppressed.

On the other hand, if excessive termination elements which do not bond on a front face of a SiC layer exist, the termination elements are diffused in an insulating layer. For example, if an insulating layer is a silicon oxide film, silicate and an oxide of the termination elements are formed in a silicon oxide film. Band offsets of silicate and an oxide of the termination elements in the insulating layer are small. Therefore, a trap state is formed, and reliability of an insulating layer may be decreased.

Therefore, a state in which termination elements more than required for bonding with a SiC layer exist on an interface between the SiC layer and an insulating layer is not preferable since device characteristics is deteriorated.

As described above, the termination element according to the present embodiment bonds on a front face of a SiC layer by exchanging electrons between two Si or between Si or C. Therefore, termination elements more than a half of the amount of Si or C having dangling bonds cannot bond on a front face of a SiC layer.

Therefore, a second area density of termination elements is preferably equal to or less than ½ of a first area density such that the termination elements do not excessively exist. In other words, the second area density of termination elements is preferably not larger than ½ of the first area density. Herein, the first area density is an area density of Si (silicon) and C (carbon) which do not bond with any of Si and C on a front face (first plane) of a SiC layer, in other words, an area density of Si or C which might have a dangling bond on a front face (first plane) of a SiC layer.

For example, a case where a front face of the drift layer 14 (first plane) is a silicon face is considered. An area density of Si (silicon) or C (carbon) on a front face of a silicon face is $2.4 \times 10^{15}$ cm$^{-2}$. All of C (carbon) on the front face of the silicon face bond with Si. Therefore, in the case of a silicon face, since Si does not bond with any of Si and C, a first area density becomes $1.2 \times 10^{15}$ cm$^{-2}$ which is a half of the above area density. Therefore, a second area density is preferably $0.6 \times 10^{16}$ cm$^{-2}$ or less, specifically, $6 \times 10^{14}$ cm$^{-2}$ or less.

If a thickness of an interface region is 0.2 nm, an area density of $6 \times 10^{14}$ cm$^{-2}$ is equivalent to $3 \times 10^{22}$ cm$^{-3}$ in a volume density. Therefore, a peak concentration of the termination element is preferably $3 \times 10^{22}$ cm$^{-3}$ or less.

An interface state density of a front face of a SiC layer is approximately $1 \times 10^{14}$ cm$^{-2}$ or less. In this case, if one of the termination elements terminates one interface state, an upper limit of the termination element becomes $1 \times 10^{14}$ cm$^{-2}$. This is 1/12 of $1.2 \times 10^{15}$ cm$^{-2}$ which is a first area density of a silicon face. Therefore, a second area density is preferably equal to or less than 1/12 of a first area density. Further, the second area density is preferably equal to or less than $1 \times 10^{14}$ cm$^{-2}$.

If a thickness of an interface region is 0.2 nm, an area density of $1 \times 10^{14}$ cm$^{-2}$ is equivalent to $5 \times 10^{21}$ cm$^{-3}$ in a volume density. Therefore, a peak concentration of the termination element is preferably $5 \times 10^{21}$ cm$^{-3}$ or less.

In general, an interface state density of a front face of a SiC layer is approximately $1 \times 10^{13}$ cm$^{-2}$. In this case, if one of the termination elements terminates one interface state, an upper limit of the termination element becomes $1 \times 10^{13}$ cm$^{-2}$. This is 1/120 of $1.2 \times 10^{15}$ cm$^{-2}$ which is a first area density of a silicon face. Therefore, a second area density is preferably equal to or less than 1/120 of a first area density. Further, the second area density is preferably equal to or less than $1 \times 10^{13}$ cm$^{-2}$.

If a thickness of an interface region is 0.2 nm, an area density of $1 \times 10^{13}$ cm$^{-2}$ is equivalent to $5 \times 10^{20}$ cm$^{-3}$ in a volume density. Therefore, a peak concentration of the termination element is preferably equal to or less than $5 \times 10^{20}$ cm$^{-3}$.

Further, if at least one of ten interface states supposed to at least exist can be terminated by the termination element, a sufficient effect is obtained to realize a terminal effect by the element. Therefore, a second area density is preferably equal to or greater than 1/200 of a first area density. Further, the second area density is preferably equal to or greater than $1 \times 10^{12}$ cm$^{-2}$.

If a thickness of an interface region is 0.2 nm, an area density of $1 \times 10^{12}$ cm$^{-2}$ is equivalent to $5 \times 10^{19}$ cm$^{-3}$ in a volume density. Therefore, a peak concentration of the termination element is preferably equal to or less than $5 \times 10^{19}$ cm$^{-3}$.

Further, to realize a terminal effect by the element, it is desirable that one of one hundred interface states supposed to at least exist terminates the termination element. Therefore, a second area density is preferably equal to or greater than 1/2000 of a first area density. Further, the second area density is preferably equal to or greater than $1 \times 10^{11}$ cm$^{-2}$.

If a thickness of an interface region is 0.2 nm, an area density of $1 \times 10^{11}$ cm$^{-2}$ is equivalent to $5 \times 10^{18}$ cm$^{-3}$ in a volume density. Therefore, a peak concentration of the termination element is preferably equal to or less than $5 \times 10^{18}$ cm$^{-3}$.

A first area density can be geometrically calculated if an orientation of a front face (first plane) of a SiC layer is determined. Further, a second area density can be calculated by, for example, a secondary ion mass spectrometry (SIMS). For example, the second area density is a value obtained by dividing an amount of the termination elements in an interface region counted by the SIMS by a beam area of an incident ion.

Further, to suppress degradation of device characteristics due to the existance of the termination element in an insulating layer, a concentration of the termination element in the insulating layer is preferably equal to or less than $1 \times 10^{18}$ cm$^{-3}$. A concentration of the termination element in the insulating layer can be confirmed by a SIMS and is preferably equal to or less than a detection limit of each termination element (approximately $1 \times 10^{17}$ cm$^{-3}$ or less).

Further, to suppress degradation of device characteristics due to the existance of the termination element in an insulating layer, the interface region 40 is preferably a monoatomic layer.

The monoatomic layer means a state in which a termination element for one atomic layer exists on a SiC front face. A physical film thickness of the interface region 40 is equal to or less than for one atom in the case where the interface region 40 is the monoatomic layer. Specifically, the thickness is less than 0.2 nm.

If the interface region 40 is a monoatomic layer, and if a number of Si (silicon) and C (carbon) which do not bond with any of Si and C and a number of termination elements are the same on a front face of a SiC layer, in other words, if a first area density and a second area density are equal, the interface region 40 is defined to be one monolayer (1 ML). In the case where the interface region 40 is a monoatomic layer, a second area density is a half of a first area density. Therefore the interface region 40 is equal to or less than ½ ML. The interface region 40 is preferably equal to or less than 1/120 ML. Further, the interface region 40 is preferably equal to or greater than 1/2000 ML.

An interface state which is not terminated by a termination element may be terminated by H (hydrogen), N (nitrogen), and F (fluorine). Therefore, the interface region 40 may include H (hydrogen), N (nitrogen), and F (fluorine).

In a termination element, as an atomic radius becomes larger, the element more stably bonds on a front face of a SiC layer. Therefore, in terms of realizing a stable termination structure, a termination element is preferably Ba (barium) or Sr (strontium). On the other hand, in terms of reducing manufacturing costs of a semiconductor device, a termination element is preferably an inexpensive element such as Mg (magnesium) and Ca (calcium).

A front face (first plane) of the drift layer 14 is preferably a face inclined at 0° or more and 8° or less with respect to a silicon face.

As described above, according to the present embodiment, an interface state between a SiC layer and a gate insulating layer is decreased, and a MISFET having high mobility is realized. Roughness on an interface between a SiC layer and a gate insulating layer is reduced. Further, a concentration in the gate insulating layer of a termination element is suppressed. Therefore, a leak current in the gate insulating layer is reduced, and reliability of the gate insulating layer is improved. Therefore, the MISFET 100 with high performance and high reliability is realized.

Second Embodiment

A semiconductor device according to a second embodiment is different from the semiconductor device according to the first embodiment in terms in which a front face (first plane) of a drift layer (SiC layer) is inclined at 0° or more and 30° or less with respect to a carbon face ((000-1) face). Description of contents described in the first embodiment will be omitted.

A configuration of a MISFET according to the present embodiment is similar to the configuration illustrated in FIG. 1. The MISFET according to the present embodiment will be described below with reference to FIG. 1.

In the MISFET according to the present embodiment, a front face of a SiC substrate 12 and a front face (first plane) of a drift layer (SiC layer) 14 are faces inclined at 0° or more and 30° or less with respect to a carbon face ((000-1) face).

An interface region 40 is provided between the drift layer (SiC layer) 14 and a gate insulating layer (insulating layer) 28. The interface region 40 includes at least one element (termination element) selected from the group consisting of Be (beryllium), Mg (magnesium), Ca (calcium), Sr (strontium), and Ba (barium).

All of Si (silicon) on a front face of a carbon face bond with C (carbon). Therefore, in the case of a carbon face, C does not bond with any of Si and C. Therefore, C forms a dangling bond.

It has been clarified by a first principle calculation by an inventor that a termination element is further stabilized by bonding with C in comparison with Si. Therefore, according to the present embodiment, in comparison with the first embodiment, a MISFET including further stable interface region 40 is realized.

In terms of realizing the further stable interface region 40, a front face of the drift layer 14 is preferably a face inclined at 0° or more and 8° or less with respect to a carbon face.

Third Embodiment

A semiconductor device according to a third embodiment is different from the semiconductor device according to the first embodiment in terms of which a front face (first plane) of a drift layer (SiC layer) is inclined at 0° or more and 30° or less in a <0001> direction. Description of contents described in the first embodiment will be omitted.

In a MISFET according to the present embodiment, a front face of a SiC substrate 12 and a front face (first plane) of a drift layer (SiC layer) 14 are inclined at 0° or more and 30° or less in a <0001> direction. For example, a front face of the drift layer 14 is an a-face or an m-face. The <0001> direction includes a [0001] direction and a [000-1] direction.

An interface region 40 is provided between the drift layer 14 and a gate insulating layer (insulating layer) 28. The interface region 40 includes at least one element (termination element) selected from the group consisting of Be (beryllium), Mg (magnesium), Ca (calcium), Sr (strontium), and Ba (barium).

On a face inclined at 0° or more and 30° or less in the <0001> direction, any of Si (silicon) and C (carbon) may form a dangling bond.

As described in the second embodiment, it has been clarified that a termination element becomes more stable by bonding with C in comparison with Si. On the other hand, for example, in the case where the gate insulating layer 28 is an oxide film, Si strongly bonds with oxygen in comparison with C.

Therefore, according to the present embodiment, more stable interface region 40 is realized by bonding a termination element to C in comparison with the first embodiment, and also bonding between a SiC layer and the gate oxide layer 28 is stabilized by bonding Si to oxygen. Therefore, a MISFET with stable device characteristics is realized.

A front face of the drift layer 14 is preferably a face inclined at 0° or more and 8° or less in the <0001> direction.

Fourth Embodiment

In a semiconductor device manufacturing method according to a fourth embodiment, ions of at least one element selected from the group consisting of Be (beryllium), Mg (magnesium), Ca (calcium), Sr (strontium), and Ba (barium) are implanted on a first plane of a SiC layer, a thermal oxide film is formed on the first plane of the SiC layer, the thermal oxide film is peeled, and a first insulating layer is formed on the first plane of the SiC layer. A semiconductor device manufacturing method according to the present embodiment is an example of a manufacturing method for the semiconductor device indicated in the first embodiment.

FIGS. 4 to 8 are schematic sectional views of a semiconductor device in manufacturing by the semiconductor device manufacturing method according to the present embodiment.

First, an $n^+$-type SiC substrate 12 is prepared which includes a front face which is a silicon face and a back face which is a carbon face. Next, an $n^-$-type drift layer (SiC layer) 14 is formed on the front face of the SiC substrate 12 by an epitaxial growth method.

Next, a p-type p-well region 16, an $n^+$-type source region 18, and a $p^+$-type p-well contact region 20 are formed by a known photolithographic method and a known ion implantation method.

Next, ions of at least one element (termination element) selected from the group consisting of Be (beryllium), Mg (magnesium), Ca (calcium), Sr (strontium), and Ba (barium) are implanted to the drift layer 14 (FIG. 4) from a front face (a first plane) of the drift layer 14. An example in which a termination element is Sr (strontium) will be described below.

Before ion implantation of Sr, for example, a cap film (second insulating layer) of an insulating film of such as a silicon oxide film may be provided on the front face of the drift layer 14. By implanting ions of Sr through the cap film, Sr in the drift layer 14 after ion implantation can be easily distributed near a front face of the drift layer 14.

Next, a thermal oxide film 42 is formed in the drift layer 14 (FIG. 5). When the thermal oxide film 42 is formed, Sr introduced into the drift layer 14 by ion implantation segregates on an interface between the drift layer 14 and the thermal oxide film 42, which are energetically stable, and forms an interface region 40. More specifically, Sr bonds with Si on the interface between the drift layer 14 and the thermal oxide film 42 and is distributed to the interface at a high concentration.

At this time, thermal oxidation is preferably performed such that almost all Sr introduced in the drift layer 14 move to the interface region 40 or the thermal oxide film 42. Specifically, a whole region in which Sr is introduced is preferably changed to the interface region 40 or the thermal oxide film 42 by thermal oxidation.

Thermal oxidation is performed, for example, at 900° C. or more and 1100° C. or less by dry oxidation.

Figure 6:
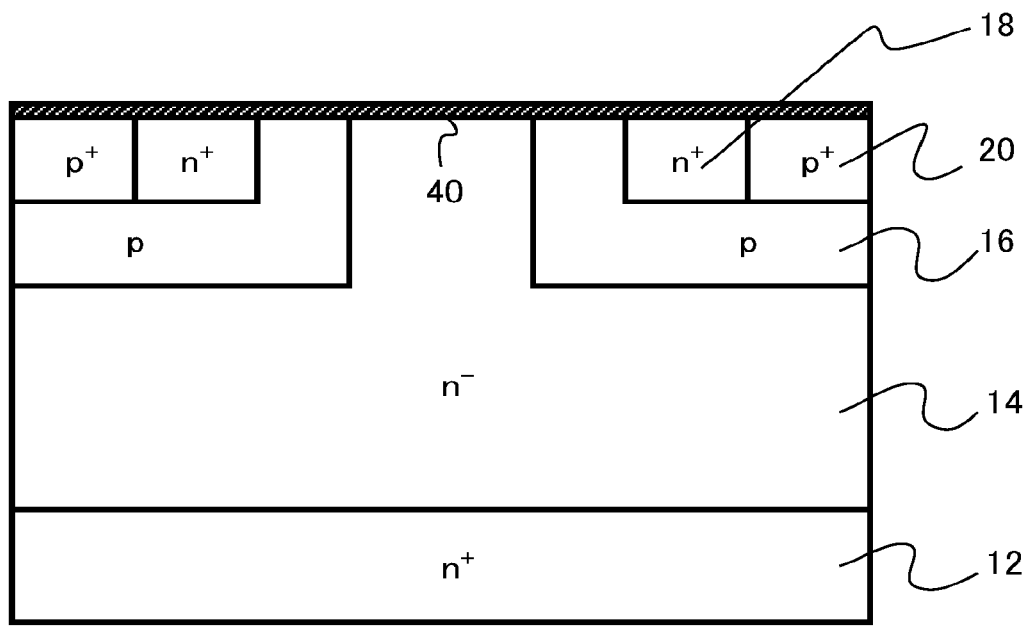
FIG. 6 is a schematic sectional view of a semiconductor device in manufacturing according to the fourth embodiment.
Figure 7:
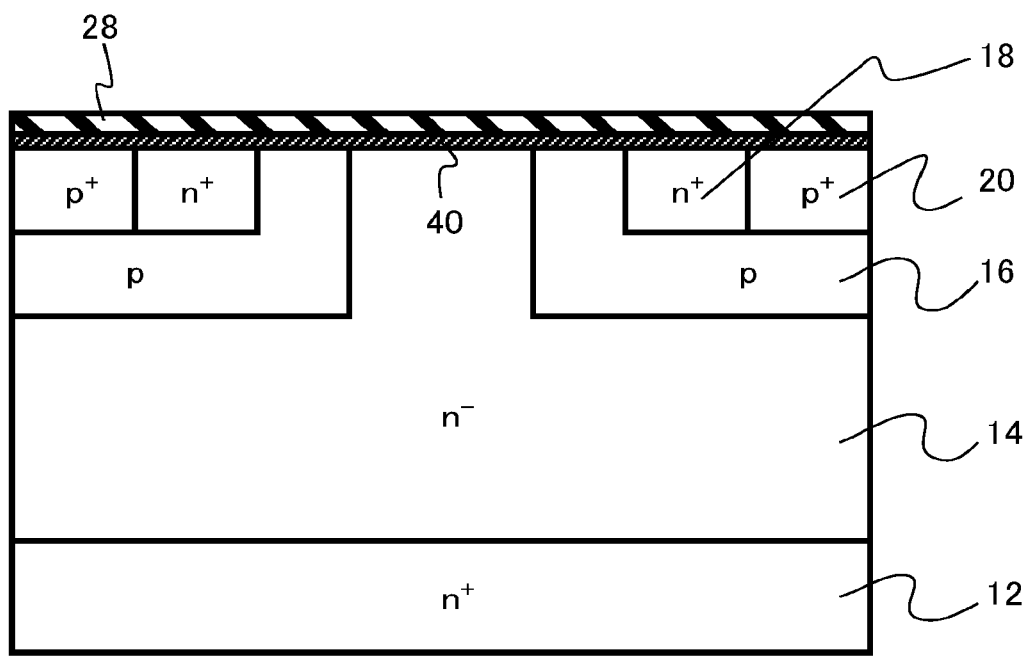
FIG. 7 is a schematic sectional view of a semiconductor device in manufacturing according to the fourth embodiment.

Next, all of the thermal oxide film 42 is removed by such as a known wet etching method (FIG. 6). Remaining interface region 40 is less than 0.2 nm.

Next, a gate insulating layer (first insulating layer) 28 is formed on the interface region 40 on a front face side of the drift layer 14. The gate insulating layer 28 is a silicon oxide film formed by a deposition method such as low pressure chemical vapor deposition (LPCVD).

After the gate insulating layer 28 is formed, annealing may be performed for densifying the gate insulating layer 28. Annealing is performed, for example, at 1200° C. or more and 1300° C. or less under inert gas atmosphere of such as nitrogen and argon.

Figure 8:
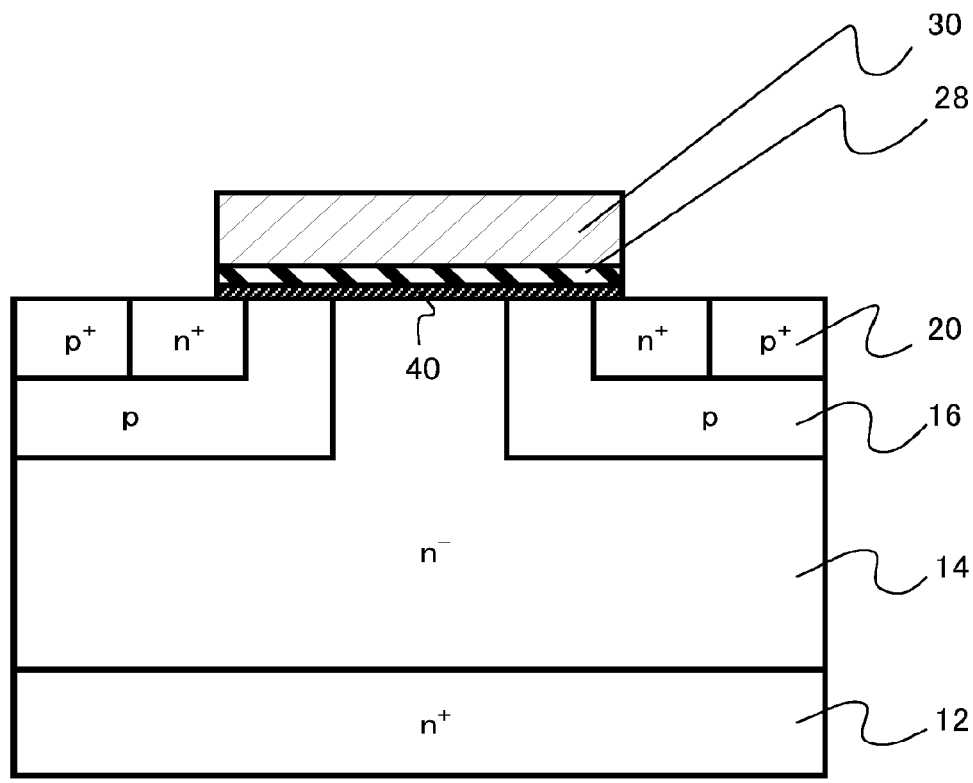
FIG. 8 is a schematic sectional view of a semiconductor device in manufacturing according to the fourth embodiment.

Next, a gate electrode 30 is formed on the gate insulating layer 28 by a known method (FIG. 8). The gate electrode 30 is, for example, doped polysilicon formed by an LPCVD method.

Then, an interlayer insulating film 32, a source electrode 34, and a drain electrode 36 are formed by a known process, and the MISFET 100 according to the present embodiment illustrated in FIG. 1 is manufactured.

In the manufacturing method according to the present embodiment, carbon dispersed in the thermal oxide film 42 and excessive termination elements are removed by peeling all of the thermal oxide film 42, and a trap state in the gate insulating layer 28 is decreased.

By the manufacturing method according to the present embodiment, a MISFET with high performance and high reliability is realized.

Fifth Embodiment

In a semiconductor device manufacturing method according to a fifth embodiment, a first film including at least one element selected from the group consisting of Be (beryllium), Mg (magnesium), Ca (calcium), Sr (strontium), and Ba (barium) is formed on a first plane of a SiC layer, and a first insulating layer is formed on the first plane of the SiC layer. A semiconductor device manufacturing method according to the present embodiment is an example of a manufacturing method for the semiconductor device indicated in the first embodiment.

Figure 9:
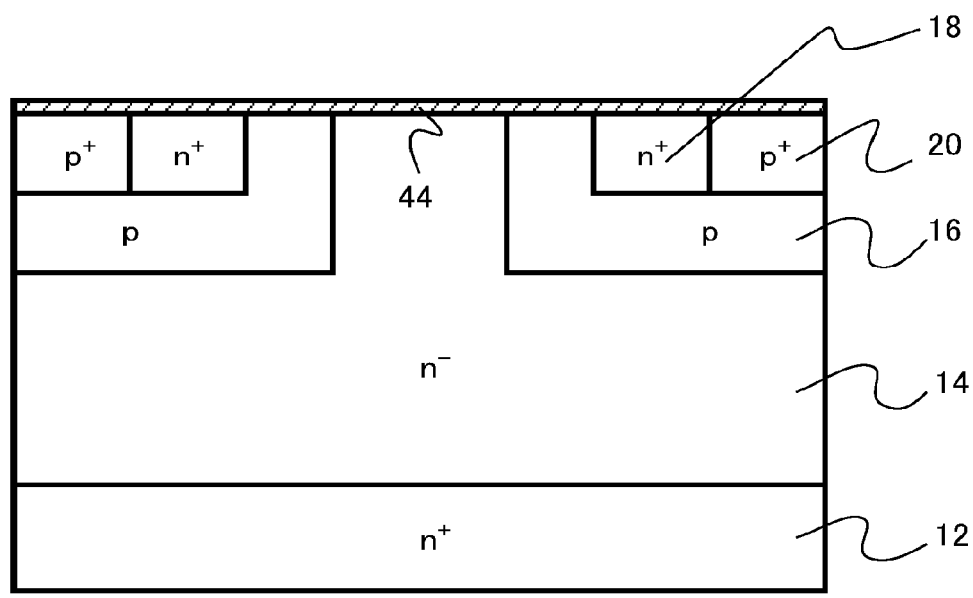
FIG. 9 is a schematic sectional view of a semiconductor device in manufacturing according to a fifth embodiment.
Figure 10:
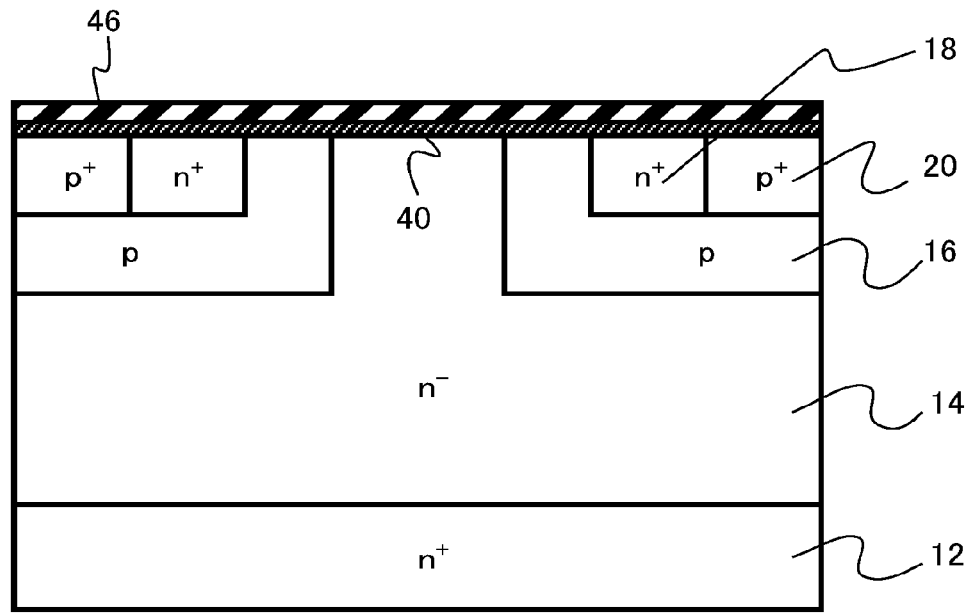
FIG. 10 is a schematic sectional view of a semiconductor device in manufacturing according to the fifth embodiment.
Figure 11:
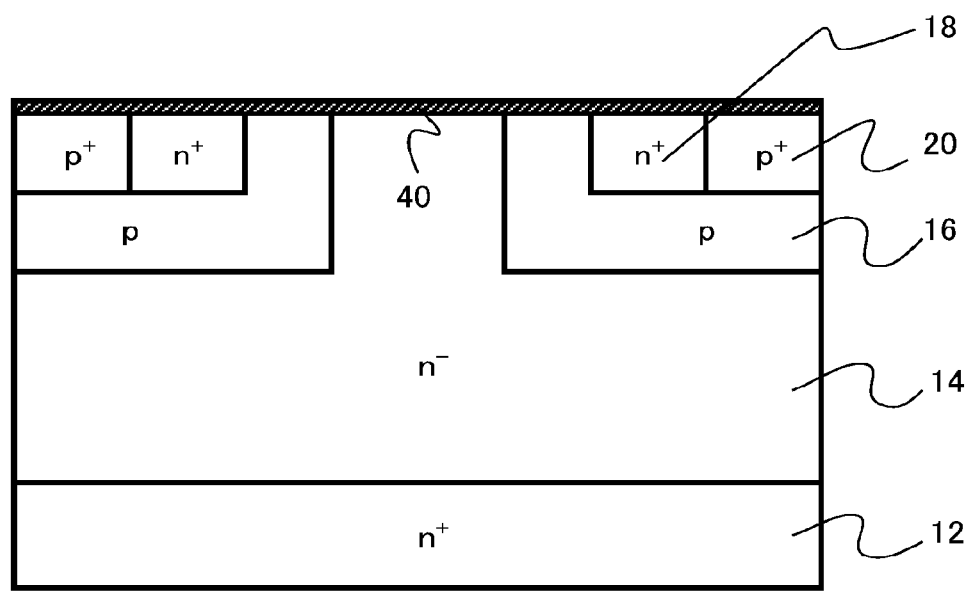
FIG. 11 is a schematic sectional view of a semiconductor device in manufacturing according to the fifth embodiment.

FIGS. 9 to 11 are schematic sectional views of a semiconductor device in manufacturing by the semiconductor device manufacturing method according to the present embodiment.

First, an n$^+$-type SiC substrate 12 is prepared which includes a front face which is a silicon face and a back face which is a carbon face. Next, an n$^-$-type drift layer (SiC layer) 14 is formed on the first plane of the SiC substrate 12 by an epitaxial growth method.

After a drift layer 14 is formed on the SiC substrate 12, a p-type p-well region 16, an n$^+$-type source region 18, and a p$^+$-type p-well contact region 20 are formed by a known photolithographic method and a known ion implantation method. Processes to this process are same as the processes in the fourth embodiment.

Next, on a front face (first plane) of the drift layer 14, a termination element containing film (first film) 44 is formed which includes at least one element (termination element) selected from the group consisting of Be (beryllium), Mg (magnesium), Ca (calcium), Sr (strontium), and Ba (barium) (FIG. 9). The termination element containing film 44 is, for example, a simple film of the termination element. The simple film is, for example, a metal film. An example in which a termination element is Sr (strontium) will be described below.

A simple film of Sr (Sr film) is formed on a front face of the drift layer 14 as the termination element containing film 44. The Sr film is formed by such as a known sputtering method. The Sr film may be formed by a vapor deposition method and a molecular beam epitaxy (MBE) method.

Next, a thermal oxide film 46 is formed by performing thermal oxidation on a front face of the drift layer 14 (FIG. 10). When the thermal oxide film 46 is formed, Sr in the termination element containing film 44 segregates on an interface between the drift layer 14 and the thermal oxide film 46, which are energetically stable, and forms an interface region 40. More specifically, Sr bonds with Si on the interface between the drift layer 14 and the thermal oxide film 46 and is distributed to the interface at a high concentration.

Next, all of the thermal oxide film 46 is removed by such as a known wet etching method (FIG. 11). Remaining interface region 40 is less than 0.2 nm.

Next, a gate insulating layer (first insulating layer) 28 is formed on the interface region 40 on a front face side of the drift layer 14 as with the fourth embodiment. Further, a gate electrode 30 is formed on the gate insulating layer 28.

Then, an interlayer insulating film 32, a source electrode 34, and a drain electrode 36 are formed by a known process, and the MISFET 100 according to the present embodiment illustrated in FIG. 1 is manufactured.

Instead of a thermal oxide film, a thermal oxynitride film may be formed by thermal oxynitride.

In the manufacturing method according to the present embodiment, carbon dispersed in the thermal oxide film 46 and excessive termination elements are removed by peeling all of the thermal oxide film 46, and a trap state in the gate insulating layer (insulating layer) 28 is decreased.

Further, an amount of Sr can be controlled by, for example, an MBE method to prevent excessive termination elements. For example, in the case where an area density of Si (silicon) and C (carbon) which do not bond with any of Si and C on a first face is set to a first area density, an amount of Sr is controlled such that a second area density, which is an area density of Sr, is equal to or less than ½ of the first area density. By this method, formation of a thermal oxide film and a thermal oxynitride film can be omitted.

By the manufacturing method according to the present embodiment, a MISFET with high performance and high reliability is realized.

Sixth Embodiment

A semiconductor device manufacturing method according to a sixth embodiment is different from the manufacturing method according to the fifth embodiment in terms in which a termination element containing film 44 is a silicate film and thermal oxidation of a SiC layer is not performed. The semiconductor device manufacturing method according to the present embodiment is an example of a manufacturing method for the semiconductor device indicated in the first embodiment.

Figure 12:
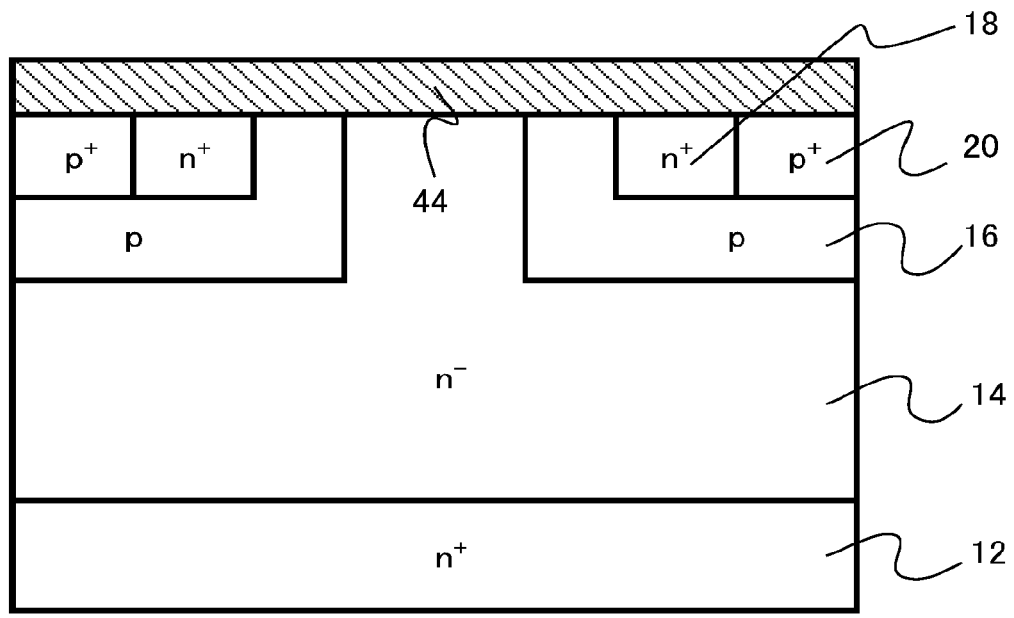
FIG. 12 is a schematic sectional view of a semiconductor device in manufacturing according to a sixth embodiment.
Figure 13:
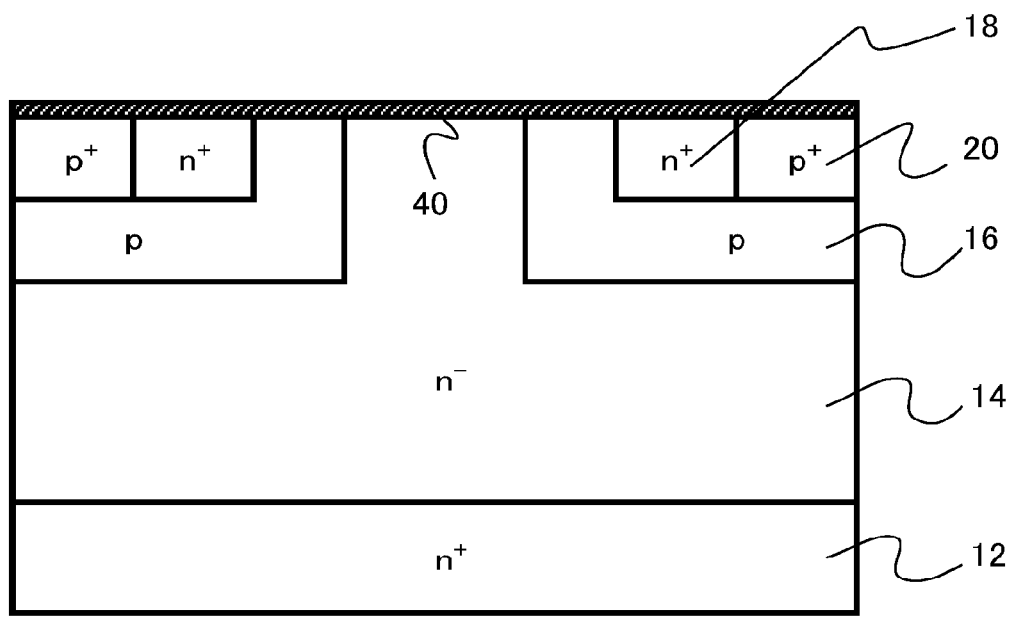
FIG. 13 is a schematic sectional view of a semiconductor device according to the sixth embodiment.

FIGS. 12 and 13 are schematic sectional views of a semiconductor device in manufacturing by the semiconductor device manufacturing method according to the present embodiment.

First, an n$^+$-type SiC substrate 12 is prepared which includes a front face which is a silicon face and a back face which is a carbon face. Next, an n$^-$-type drift layer (SiC layer) 14 is formed on the first plane of the SiC substrate 12 by an epitaxial growth method.

After an n$^-$-type drift layer (SiC layer) 14 is formed on the SiC substrate 12, a p-type p-well region 16, an n$^+$-type source region 18, and a p$^+$-type p-well contact region 20 are formed by a known photolithographic method and a known ion implantation method. Processes to this process are same as the processes in the fifth embodiment.

Next, on a front face (first plane) of the drift layer 14, a termination element containing film (first film) 44 is formed which includes at least one element (termination element) selected from the group consisting of Be (beryllium), Mg (magnesium), Ca (calcium), Sr (strontium), and Ba (barium) (FIG. 12). The film containing a termination element is a silicate film of the termination element. An example in which a termination element is Sr (strontium) will be described below.

A silicate film of Sr (SrSiO film) is formed on a front face of the drift layer 14 as the termination element containing film 44. The SrSiO film is formed by such as a known sputtering method.

Next, the termination element containing film 44 is removed by etching (FIG. 13). Etching is performed by a known dry etching method.

When the termination element containing film 44 is etched, Sr in the termination element containing film 44 segregates on a front face of energetically stable drift layer 14 and forms an interface region 40. More specifically, Sr bonds with Si on the front face of the drift layer 14 and is distributed to an interface at a high concentration.

An interface termination structure by a termination element is energetically extremely stable. Therefore, when Sr can be freely moved by etching the termination element containing film 44, Sr can move on a front face of the drift layer 14 so as to form an interface termination structure. When Sr bonds with a dangling bond and segregates on an interface.

Next, a gate insulating layer (first insulating layer) 28 is formed on the interface region 40 on a front face side of the drift layer 14 as with the fifth embodiment. Further, a gate electrode 30 is formed on the gate insulating layer 28.

Then, an interlayer insulating film 32, a source electrode 34, and a drain electrode 36 are formed by a known process, and the MISFET 100 according to the present embodiment illustrated in FIG. 1 is manufactured.

By the manufacturing method according to the present embodiment, a MISFET with high performance and high reliability is realized.

Seventh Embodiment

A semiconductor device according to a seventh embodiment is similar to the semiconductor device according to the first embodiment other than that a MISFET is a trench gate type. Therefore, description of contents described in the first embodiment will be omitted.

Figure 14:
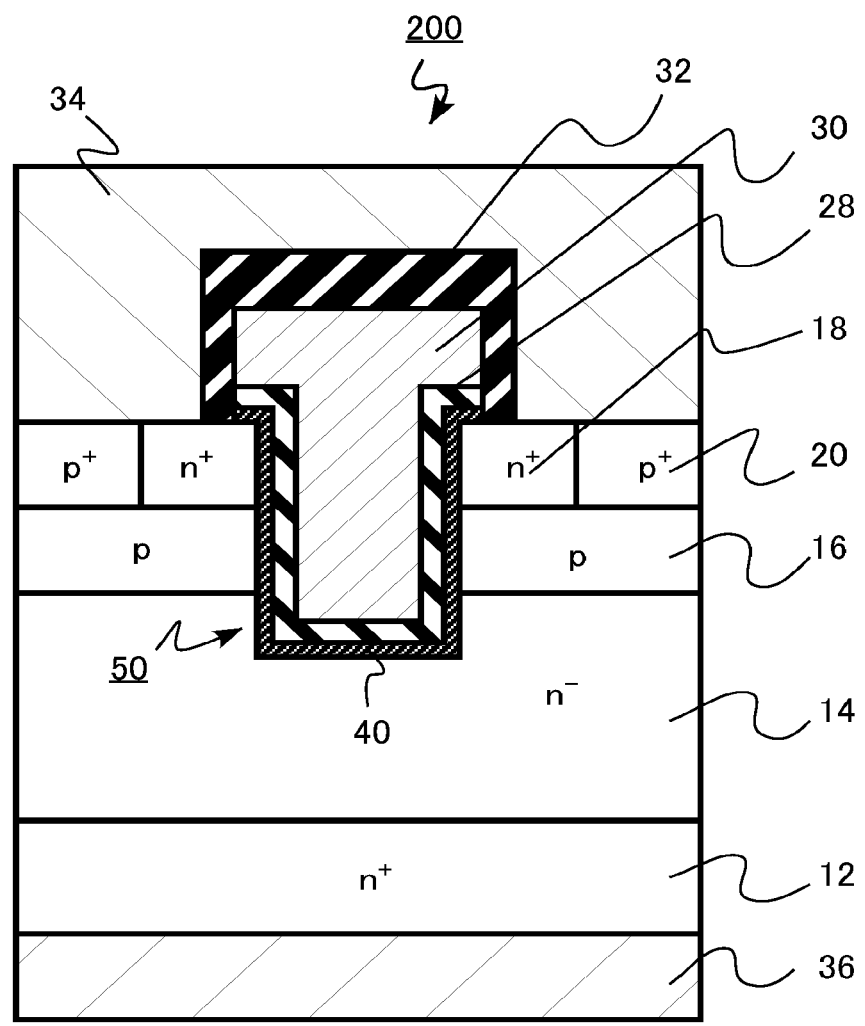
FIG. 14 is a schematic sectional view of a semiconductor device according to a seventh embodiment.

FIG. 14 is a schematic sectional diagram illustrating a configuration of a MISFET which is a semiconductor device of the present embodiment. This MISFET 200 is a trench gate type MISFET in which a gate insulating layer and a gate electrode are provided in a trench.

The MISFET 200 includes an n$^+$-type SiC substrate 12 having a front face and a back face. In FIG. 14, a front face is a face on an upper side in the figure, and a back face is a face on a lower side in the figure. A front face of the SiC substrate 12 is a face inclined at 0° or more and 8° or less with respect to a silicon face.

The SiC substrate 12 is, for example, a SiC substrate of 4H—SiC.

An n$^-$-type drift layer (SiC layer) 14 is formed on a front face of the SiC substrate 12. The drift layer 14 is, for example, an epitaxial layer formed by epitaxial growing on the SiC substrate 12. A front face of the drift layer 14 is a face inclined at 0° or more and 8° or less with respect to a silicon face.

A p-type p-well region (SiC layer) 16 is formed on a part of a front face of the drift layer 14. The p-well region 16 functions as a channel region of the MISFET 200.

An n$^+$-type source region 18 is formed on a part of a front face of the p-well region 16. Further, a p$^+$-type p-well contact region 20 is formed on a part of a front face of the p-well region 16, specifically on a side of the source region 18.

A trench 50 is provided in a direction toward the SiC substrate 12 from a front face of the drift layer 14. An inner wall surface of the trench 50 is, for example, an m-face or and an a-face.

A gate insulating layer (insulating layer) 28 continuously formed over front faces (first faces) of the drift layer 14, the p-well region 16, and the source region 18 is included in the trench 50.

A gate electrode 30 is formed on the gate insulating layer 28. The p-well region 16 sandwiched between the source region 18 and the drift layer 14 on a side face of the trench 50 functions as a channel region of the MISFET 200.

The gate insulating layer 28 is provided between the gate electrode 30 and the drift layer 14. An interface region 40 is provided on an interface between the drift layer 14 and the gate insulating layer 28. The interface region 40 includes at least one element (termination element) selected from the group consisting of Be (beryllium), Mg (magnesium), Ca (calcium), Sr (strontium), and Ba (barium).

A conductive source electrode 34 electrically connected to the source region 18 and the p-well contact region 20 is provided. The source electrode 34 functions as a p-well electrode which applies a potential to the p-well region 16. Further, a conductive drain electrode 36 is formed on a side opposed to the drift layer 14 on the SiC substrate 12, specifically a second face side.

According to the present embodiment, effects as in the first embodiment can be obtained by existence of the interface region 40. Further, integration of a MISFET can be improved by applying a trench gate structure, and a conductive loss is reduced by eliminating a JFET region.

Eighth Embodiment

A semiconductor device according to an eighth embodiment is similar to the semiconductor device according to the first embodiment other than that an IGBT is used instead of a MISFET. Therefore, description of contents described in the first embodiment will be omitted.

Figure 15:
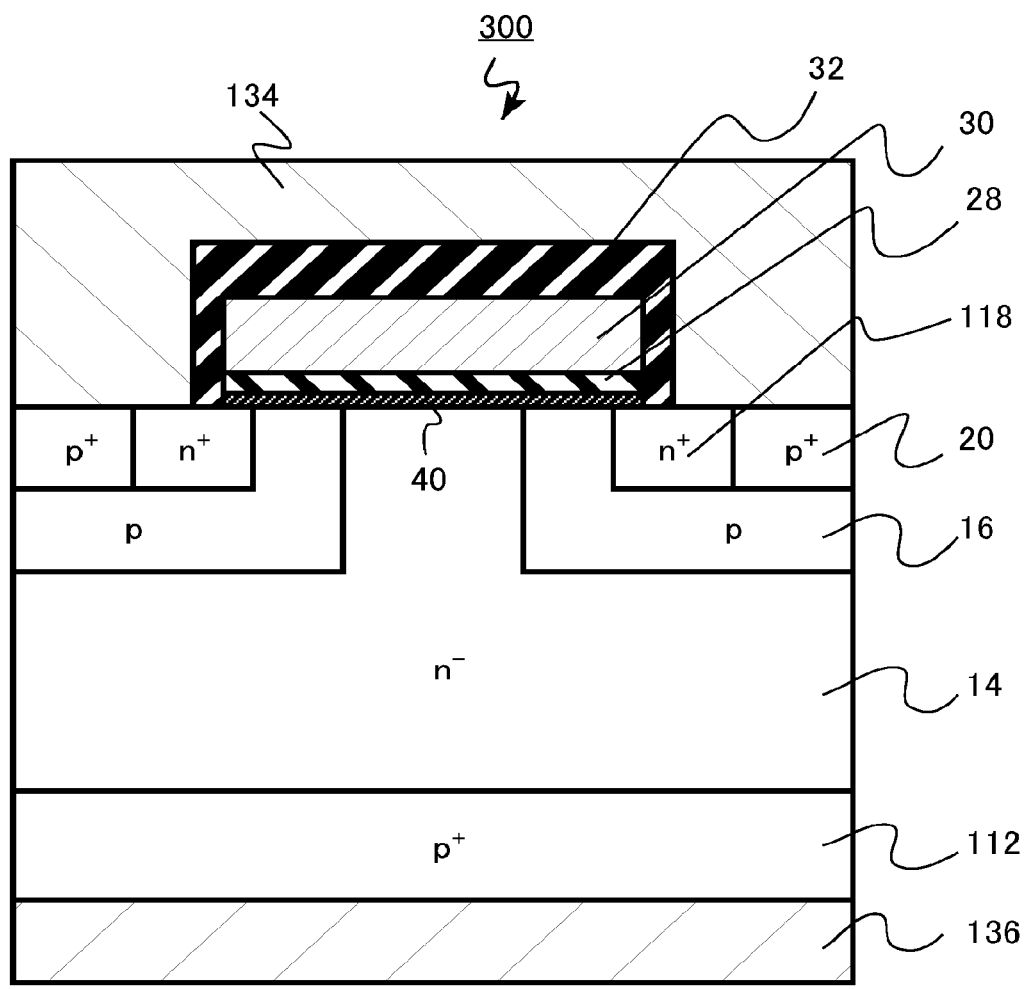
FIG. 15 is a schematic sectional view of a semiconductor device according to an eighth embodiment.

FIG. 15 is a schematic sectional view illustrating a configuration of an IGBT which is a semiconductor device of the present embodiment.

This IGBT 300 includes a p+-type SiC substrate 112 having a front face and a back face. In FIG. 15, a front face is a face on an upper side in the figure, and a back face is a face on a lower side in the figure. A front face of the SiC substrate 112 is a face inclined at 0° or more and 8° or less with respect to a silicon face.

An n−-type drift layer (SiC layer) 14 is formed on a front face of the SiC substrate 112. The drift layer 14 is, for example, an epitaxial layer formed by epitaxial growing on the SiC substrate 112. A front face (a first plane) of the drift layer 14 is a face inclined at 0° or more and 8° or less with respect to a silicon face.

A p-type p-well region (SiC layer) 16 is formed on a part of a front face of the drift layer 14. The p-well region 16 functions as a channel region of the IGBT 300.

An n+-type emitter region 118 is formed on a part of a front face of the p-well region 16. Further, a p+-type p-well contact region 20 is formed on a part of a front face of the p-well region 16 and on a side of the emitter region 118.

A gate insulating layer (insulating layer) 28 is provided which is continuously formed over the drift layer 14 and the p-well region 16.

A gate electrode 30 is formed on the gate insulating layer 28. On the gate electrode 30, for example, an interlayer insulating film 32 formed of a silicon oxide film is formed.

The p-well region 16 sandwiched between the source region 18 and the drift layer 14 under the gate electrode 30 functions as a channel region of the MISFET 100.

The gate insulating layer 28 is provided between the gate electrode 30 and the drift layer 14. An interface region 40 is provided on an interface between the drift layer 14 and the gate insulating layer 28. The interface region 40 includes at least one element (termination element) selected from the group consisting of Be (beryllium), Mg (magnesium), Ca (calcium), Sr (strontium), and Ba (barium).

A conductive emitter electrode 134 is provided which is electrically connected to the emitter region 118 and the p-well contact region 20. The emitter electrode 134 functions as a p-well electrode which applies a potential to the p-well region 16.

Further, a conductive collector electrode 136 is formed on a side opposed to the drift layer 14 on the SiC substrate 112, specifically a second face side.

According to the present embodiment, actions and effects as in the first embodiment can be obtained by existence of the interface region 40. Therefore, the IGBT 300 with high performance and high reliability is realized.

Ninth Embodiment

A semiconductor device according to a ninth embodiment is different from the semiconductor device according to the first embodiment in terms in which an interface region is provided in a junction termination region of a MISFET. Description of contents described in the first embodiment will be omitted.

Figure 16:
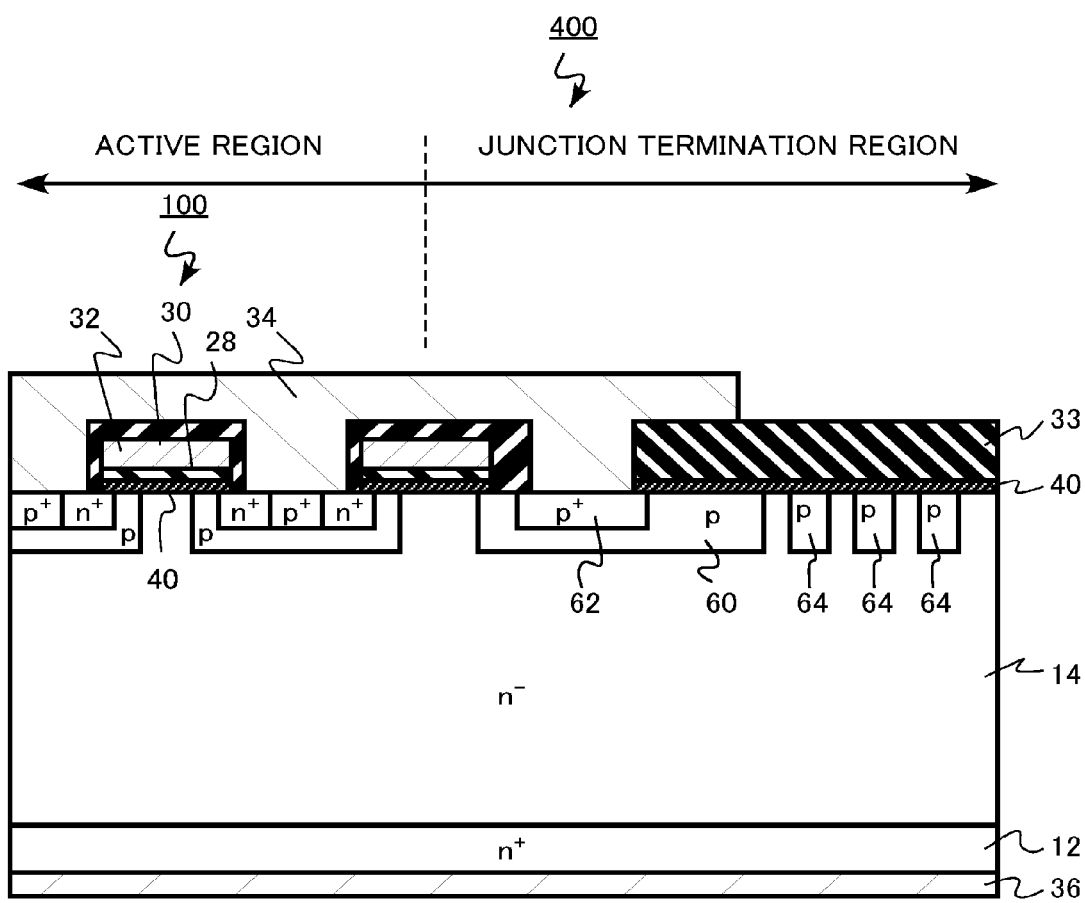
FIG. 16 is a schematic sectional view of a semiconductor device according to a ninth embodiment.

FIG. 16 is a schematic sectional view illustrating a configuration of a MISFET which is a semiconductor device according to the present embodiment. A MISFET 400 includes an active region (element region) and a junction termination region around the active region. The junction termination region has a function to improve a breakdown voltage of the MISFET 400.

On an active region, for example, the MISFET 100 according to the first embodiment is disposed as a unit cell.

The junction termination region includes a p-type resurf region (SiC layer) 60, a p+-type contact region 62, a p-type guard ring region (SiC layer) 64, a field oxide film (insulating layer) 33, and an interface region 40. The interface region 40 is provided among front faces (first faces) of the p-type resurf region 60 and the p-type guard ring region 64 and the field oxide film 33.

The interface region 40 includes at least one element (termination element) selected from the group consisting of Be (beryllium), Mg (magnesium), Ca (calcium), Sr (strontium), and Ba (barium).

The field oxide film 33 is, for example, a silicon oxide film. A concentration of a termination element in the field oxide film 33 is preferably equal to or less than $1 \times 10^{18}$ cm$^{-3}$. A concentration of the termination element in the field oxide film 33 can be confirmed by a SIMS and is preferably equal to or less than a detection limit of each termination element (approximately $1 \times 10^{17}$ cm$^{-3}$ or less). A concentration of the termination element in the field oxide film 33 is, for example, a concentration at a position away from 1 nm or more from a concentration peak of a termination element in the interface region 40.

When a MISFET 400 is turned off, a depletion layer is formed in the resurf region 60, the guard ring region 64, and a drift layer 14 between the guard ring regions 64. Therefore, a breakdown voltage of the MISFET 400 is improved.

However, if an interface state exists on an interface among the resurf region 60, the guard ring region 64, and the field oxide film 33, an electrical charge is trapped in the interface state. By an electric field of the trapped electrical charge, a desired depletion layer may not be formed. In this case, a breakdown voltage of the MISFET 400 is degraded.

According to the present embodiment, an interface state is terminated by providing the interface region 40. Therefore, a MISFET in realized in which a desired depletion layer is formed, and a breakdown voltage is stabilized.

Tenth Embodiment

A semiconductor device according to a tenth embodiment is different from the semiconductor device according to the first embodiment in terms in which an interface region is provided in a junction termination region of PIN diode of SiC. Description of contents described in the first embodiment will be omitted.

Figure 17:
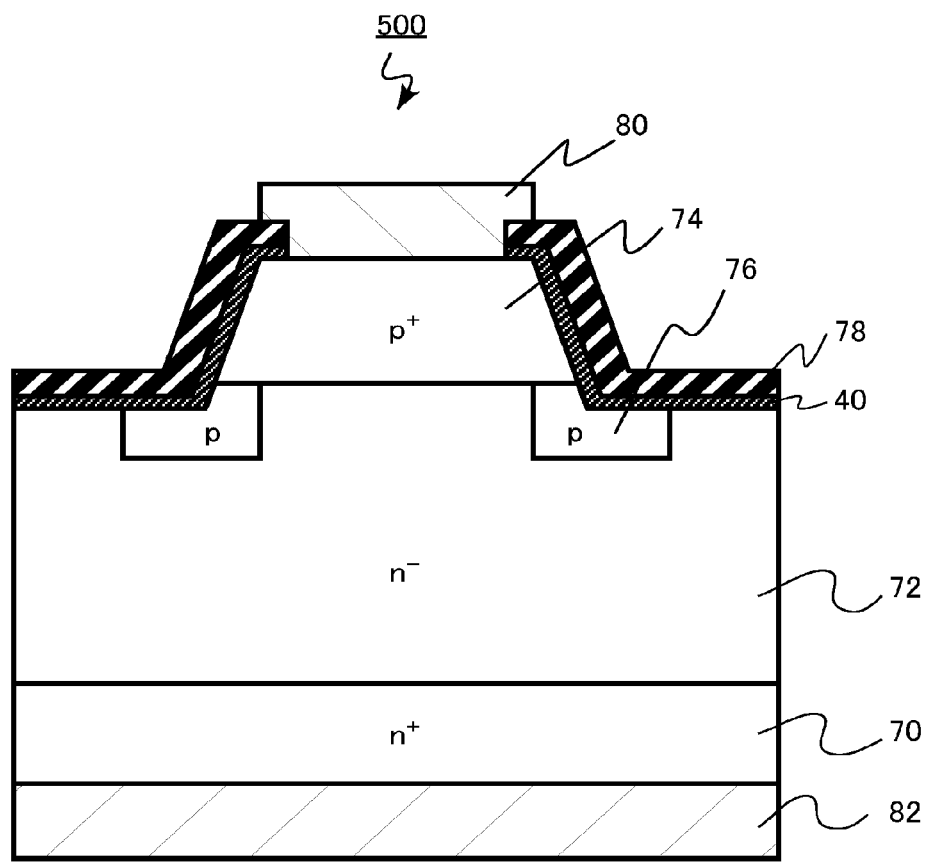
FIG. 17 is a schematic sectional view of a semiconductor device according to a tenth embodiment.

FIG. 17 is a schematic sectional view illustrating a configuration of a PIN diode which is the semiconductor device according to the present embodiment.

A PIN diode 500 includes an n+-type cathode region 70, an n−-type drift layer (SiC layer) 72, a p+-type anode region 74, a p-type guard ring (SiC layer) 76, an interface region 40, a protection film (insulating layer) 78, an anode electrode 80, and a cathode electrode 82.

The interface region 40 is provided among the guard ring 76, the drift layer 72, and the protection film 78.

The interface region 40 includes at least one element (termination element) selected from the group consisting of Be (beryllium), Mg (magnesium), Ca (calcium), Sr (strontium), and Ba (barium).

The protection film 78 is, for example, a silicon oxide film. A concentration of a termination element of the protection film 78 is preferably equal to or less than $1 \times 10^{18}$ cm$^{-3}$. A concentration of the termination element in the protection film 78 can be confirmed by a SIMS and is preferably equal to or less than a detection limit of each termination element (approximately $1\times10^{17}$ cm$^{-3}$ or less). A concentration of a termination element in the protection film 78 is, for example, a concentration at a position away from 1 nm or more from a concentration peak of a termination element in the interface region 40.

When the PIN diode 500 is turned off, a breakdown voltage of the PIN diode 500 is improved by forming a depletion layer to the guard ring 76 and the drift layer 72.

However, if an interface state exists on an interface among the guard ring 76, the drift layer 72, and the protection film 78, an electrical charge is trapped in the interface state. By an electric field of the trapped electrical charge, a desired depletion layer may not be formed. In this case, a breakdown voltage of the PIN diode 500 is degraded.

According to the present embodiment, an interface state is terminated by providing the interface region 40. Therefore, a PIN diode is realized in which a desired depletion layer is formed, and a breakdown voltage is stabilized.

Eleventh Embodiment

A semiconductor device according to an eleventh embodiment is different from the semiconductor device according to the first embodiment in terms in which an interface region is provided in a junction termination region of a Schottky barrier diode (SBD) of SiC. Description of contents described in the first embodiment will be omitted.

Figure 18:
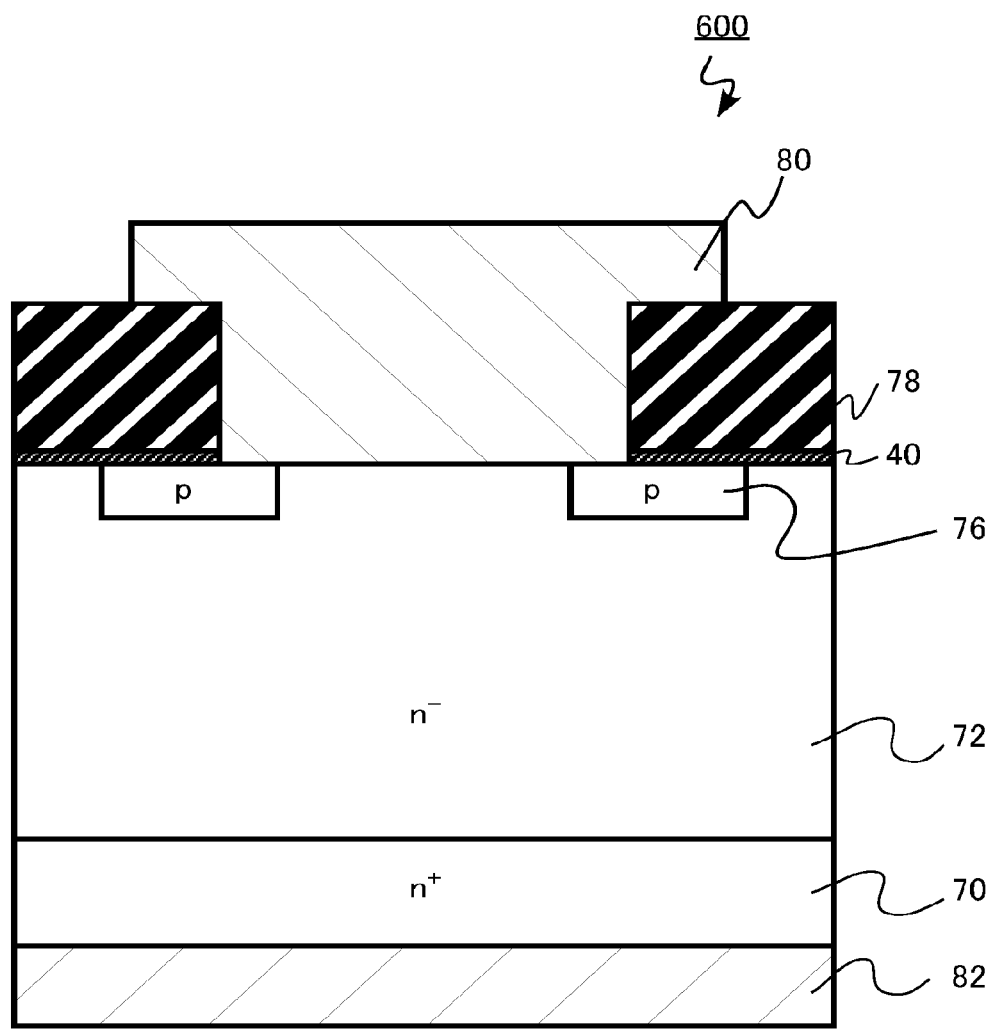
FIG. 18 is a schematic sectional view of a semiconductor device according to an eleventh embodiment.

FIG. 18 is a schematic sectional view illustrating a configuration of an SBD which is the semiconductor device of the present embodiment.

An SBD 600 includes an n$^+$-type cathode region 70, an n$^-$-type drift layer (SiC layer) 72, a p-type guard ring (SiC layer) 76, an interface region 40, a protection film (insulating layer) 78, an anode electrode 80, and a cathode electrode 82.

The interface region 40 is provided among the guard ring 76, the drift layer 72, and the protection film 78.

The interface region 40 includes at least one element (termination element) selected from the group consisting of Be (beryllium), Mg (magnesium), Ca (calcium), Sr (strontium), and Ba (barium).

The protection film 78 is, for example, a silicon oxide film. A concentration of a termination element of the protection film 78 is preferably equal to or less than $1\times10^{18}$ cm$^{-3}$. A concentration of the termination element in the protection film 78 can be confirmed by a SIMS and is preferably equal to or less than a detection limit of each termination element (approximately $1\times10^{17}$ cm$^{-3}$ or less). A concentration of a termination element in the protection film 78 is, for example, a concentration at a position away from 1 nm or more from a concentration peak of a termination element in the interface region 40.

When the SBD 600 is turned off, a breakdown voltage of the SBD 600 is improved by forming a depletion layer to the guard ring 76 and the drift layer 72.

However, if an interface state exists on an interface among the guard ring 76, the drift layer 72, and the protection film 78, an electrical charge is trapped in the interface state. By an electric field of the trapped electrical charge, a desired depletion layer may not be formed. In this case, a breakdown voltage of the SBD 600 is degraded.

According to the present embodiment, an interface state is terminated by providing the interface region 40. Therefore, an SBD is realized in which a desired depletion layer is formed, and a breakdown voltage is stabilized.

Twelfth Embodiment

A semiconductor device of a twelfth embodiment includes a SiC layer including a first plane, a metal electrode, and a region provided between the first plane of the SiC layer and the metal electrode. The region includes at least one element selected from the group consisting of Be (beryllium), Mg (magnesium), Ca (calcium), Sr (strontium), and Ba (barium). In the region, a full width at half maximum of a concentration peak of the element is equal to or less than 1 nm, and in a case where an area density of Si (silicon) and C (carbon) which do not bond with any of Si and C on the first plane is set to a first area density, a second area density which is an area density of the element is equal to or less than ½ of the first area density.

A semiconductor device according to the twelfth embodiment is different from the semiconductor device according to the eleventh embodiment in terms in which an interface region is also provided between an anode electrode and a drift layer. Description of contents described in the eleventh embodiment will be omitted.

Figure 19:
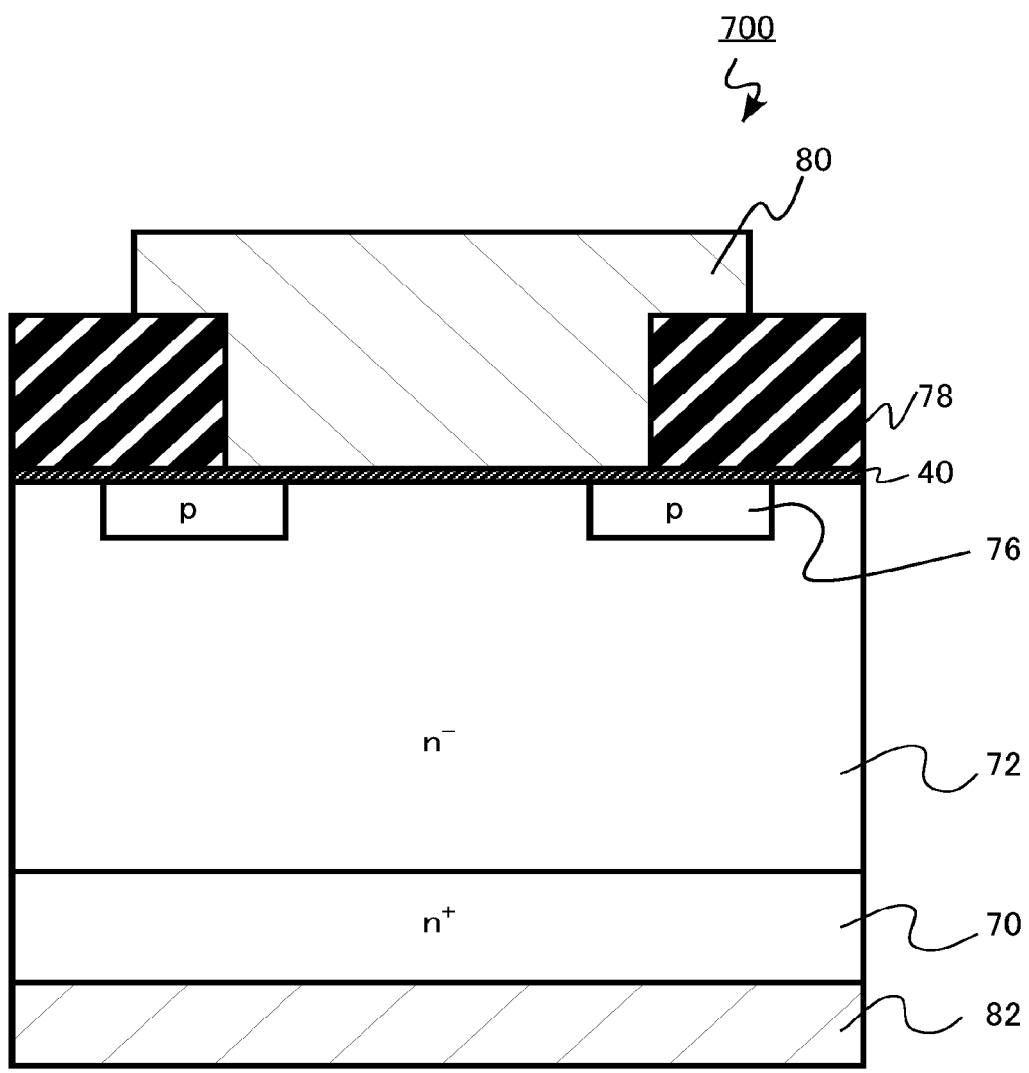
FIG. 19 is a schematic sectional view of a semiconductor device according to a twelfth embodiment.

FIG. 19 is a schematic sectional view illustrating a configuration of an SBD which is the semiconductor device of the present embodiment.

An SBD 600 includes an n$^+$-type cathode region 70, an n$^-$-type drift layer (SiC layer) 72, a p-type guard ring (SiC layer) 76, an interface region 40, a protection film (insulating layer) 78, an anode electrode (metal electrode) 80, and a cathode electrode 82.

The interface region 40 is provided among the guard ring 76, the drift layer 72, and the protection film 78. The interface region 40 is also provided between the drift layer 72 and the anode electrode 80.

The interface region 40 includes at least one element (termination element) selected from the group consisting of Be (beryllium), Mg (magnesium), Ca (calcium), Sr (strontium), and Ba (barium).

The termination element is segregated on an interface between the drift layer 72 and the anode electrode 80. A full width at half maximum of a concentration peak of the termination element is equal to or less than 1 nm. The full width at half maximum of the concentration peak is preferably equal to or less than 0.5 nm and more preferably less than 0.2 nm.

The interface region 40 is preferably a monoatomic layer.

An area density of Si (silicon) and C (carbon) which do not bond with any of Si and C on a front face (first plane) of the drift layer 72 is defined as a first area density. Further, an area density of a termination element is defined as a second area density. The second area density is equal to or less than ½ of the first area density.

The second area density is preferably equal to or less than 1/120 of the first area density. Further, the second area density is preferably equal to or greater than 1/12000 of the first area density.

A concentration peak of a termination element in the interface region 40 is preferably equal to or greater than $5\times10^{18}$ cm$^{-3}$. Further, the concentration peak is more preferably equal to or greater than $1\times10^{19}$ cm$^{-3}$.

The protection film 78 is, for example, a silicon oxide film.

If an interface state exists on an interface between the drift layer 72 and the anode electrode 80, fermi level pinning is caused. Therefore, a desired Schottky barrier may not be realized between the drift layer 72 and the anode electrode 80.

According to the present embodiment, an interface state is terminated by providing the interface region 40. Therefore, an SBD including a desired Schottky barrier determined by a work function of the anode electrode 80 is realized.

Thirteenth Embodiment

A semiconductor device according to a thirteenth embodiment includes a diamond layer including a first plane, an insulating layer, and a region provided between the first plane of the diamond layer and the insulating layer. The region includes at least one element selected from the group consisting of Be (beryllium), Mg (magnesium), Ca (calcium), Sr (strontium), and Ba (barium). In the region, a full width at half maximum of a concentration peak of the element is equal to or less than 1 nm, and in a case where an area density of C (carbon) which does not bond with any of C on the first plane is set to a first area density, a second area density which is an area density of the element is equal to or less than ½ of the first area density.

The thirteenth embodiment is similar to the eleventh embodiment other than that diamond instead of SiC is used as a semiconductor material. Therefore, description of contents described in the eleventh embodiment will be omitted.

Figure 20:
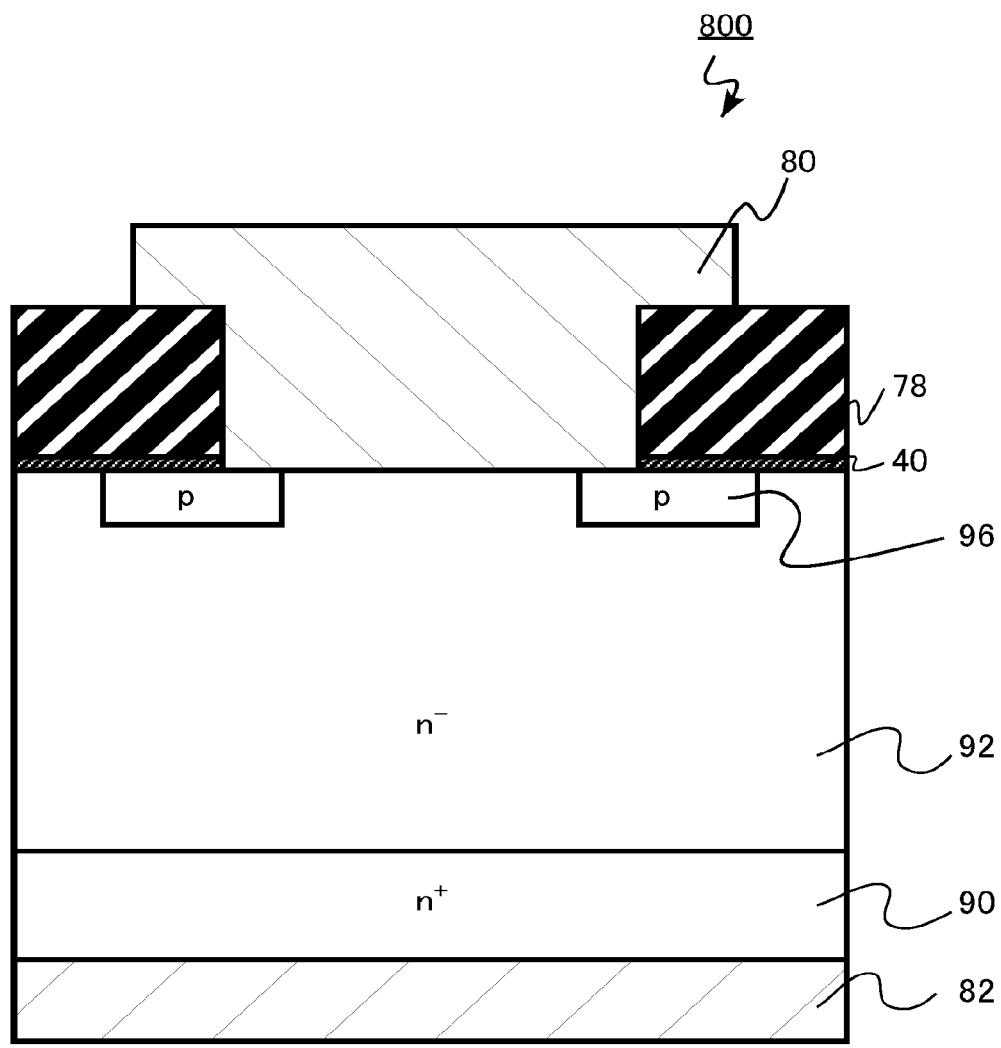
FIG. 20 is a schematic sectional view of a semiconductor device according to a thirteenth embodiment.

FIG. 20 is a schematic sectional view of a configuration of an SBD which is the semiconductor device according to the present embodiment.

An SBD 800 includes an n$^+$-type cathode region 90, an n$^-$-type drift layer (diamond layer) 92, a p-type guard ring (diamond layer) 96, an interface region 40, a protection film (insulating layer) 78, an anode electrode 80, and a cathode electrode 82.

The interface region 40 is provided among the p-type guard ring 96, the n$^-$-type drift layer 92, and the protection film 78.

The interface region 40 includes at least one element (termination element) selected from the group consisting of Be (beryllium), Mg (magnesium), Ca (calcium), Sr (strontium), and Ba (barium).

The termination element is segregated on an interface between the drift layer 92 and the protection film (insulating layer) 78. A full width at half maximum of a concentration peak of the termination element is equal to or less than 1 nm. The full width at half maximum of the concentration peak is preferably equal to or less than 0.5 nm and more preferably less than 0.2 nm.

The interface region 40 is preferably a monoatomic layer.

An area density of C (carbon) which does not bond with C on a front face (first plane) of the drift layer 92 is defined as a first area density. Further, an area density of a termination element is defined as a second area density. The second area density is equal to or less than ½ of the first area density.

The second area density is preferably equal to or less than 1/120 of the first area density. Further, the second area density is preferably equal to or greater than 1/12000 of the first area density.

A concentration peak of a termination element in the interface region 40 is preferably equal to or greater than $5 \times 10^{18}$ cm$^{-3}$. Further, the concentration peak is more preferably equal to or greater than $1 \times 10^{19}$ cm$^{-3}$.

The protection film 78 is, for example, a silicon oxide film. A concentration of a termination element of the protection film 78 is preferably equal to or less than $1 \times 10^{18}$ cm$^{-3}$. A concentration of the termination element in the protection film 78 can be confirmed by a SIMS and is preferably equal to or less than a detection limit of each termination element (approximately $1 \times 10^{17}$ cm$^{-3}$ or less). A concentration of a termination element in the protection film 78 is, for example, a concentration at a position away from 1 nm or more from a concentration peak of a termination element in the interface region 40.

When the SBD 800 is turned off, a breakdown voltage of the SBD 800 is improved by forming a depletion layer to the guard ring 96 and the drift layer 92.

However, if an interface state exists on an interface among the guard ring 96, the drift layer 92, and the protection film 78, an electrical charge is trapped in the interface state. By an electric field of the trapped electrical charge, a desired depletion layer may not be formed. In this case, a breakdown voltage of the SBD 800 is degraded.

A carbon dangling bond also exists on a front face of a diamond layer similarly to a SiC layer of a carbon face, for example. A termination element terminates the dangling bond by bonding with C (carbon).

According to the present embodiment, an interface state is terminated by providing the interface region 40. Therefore, an SBD is realized in which a desired depletion layer is formed, and a breakdown voltage is stabilized.

Further, as described above, it has been clarified that a termination element becomes more stable by bonding with C in comparison with Si. In the case where diamond is used as a semiconductor material, all of termination elements in the interface region 40 bond with C. Therefore, an SBD including the extremely stabilized interface region 40 is realized.

Variation of Thirteenth Embodiment

Figure 21:
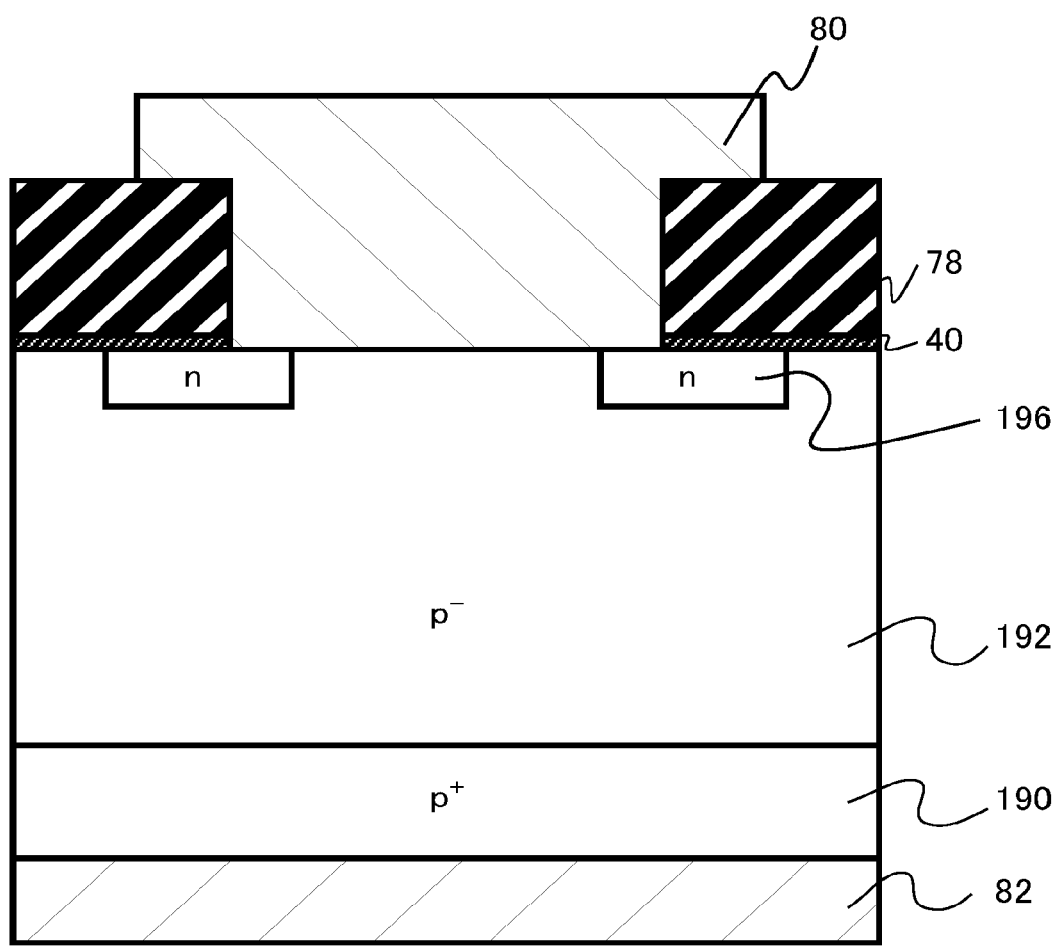
FIG. 21 is a schematic sectional view of a semiconductor device according to a variation of the thirteenth embodiment.

FIG. 21 is a schematic sectional diagram illustrating a configuration of an SBD which is a semiconductor device according to a variation of the present embodiment.

The SBD according to the variation includes a p$^+$-type cathode region 190, a p$^-$-type drift layer (diamond layer) 192, an n-type guard ring (diamond layer) 196, an interface region 40, a protection film (insulating layer) 78, an anode electrode 80, and a cathode electrode 82.

The interface region 40 is provided among the n-type guard ring 196, the p$^-$-type drift layer 192, and the protection film 78.

The interface region 40 includes at least one element (termination element) selected from the group consisting of Be (beryllium), Mg (magnesium), Ca (calcium), Sr (strontium), and Ba (barium).

The SBD according to the variation is different from the SBD according to the present embodiment in terms in which an n-type and a p-type are inverted. According to the variation, an interface state is terminated by providing the interface region 40. Therefore, an SBD is realized in which a desired depletion layer is formed, and a breakdown voltage is stabilized.

Fourteenth Embodiment

A semiconductor device according to a fourteenth embodiment includes a diamond layer including a first plane, a metal electrode, and a region provided between the first plane of the diamond layer and the metal electrode. The region includes at least one element selected from the group consisting of Be (beryllium), Mg (magnesium), Ca (calcium), Sr (strontium), and Ba (barium). In the region, a full width at half maximum of a concentration peak of the element is equal to or less than 1 nm. In a case where an area density of C (carbon) which does not bond with any of C on the first plane is set to a first area density, a second area density which is an area density of the element is equal to or less than ½ of the first area density.

The semiconductor device according to the present embodiment is different from the semiconductor device according to the thirteenth embodiment in terms in which an interface region is also provided between an anode electrode and a drift layer. Description of contents described in the thirteenth embodiment will be omitted.

Figure 22:
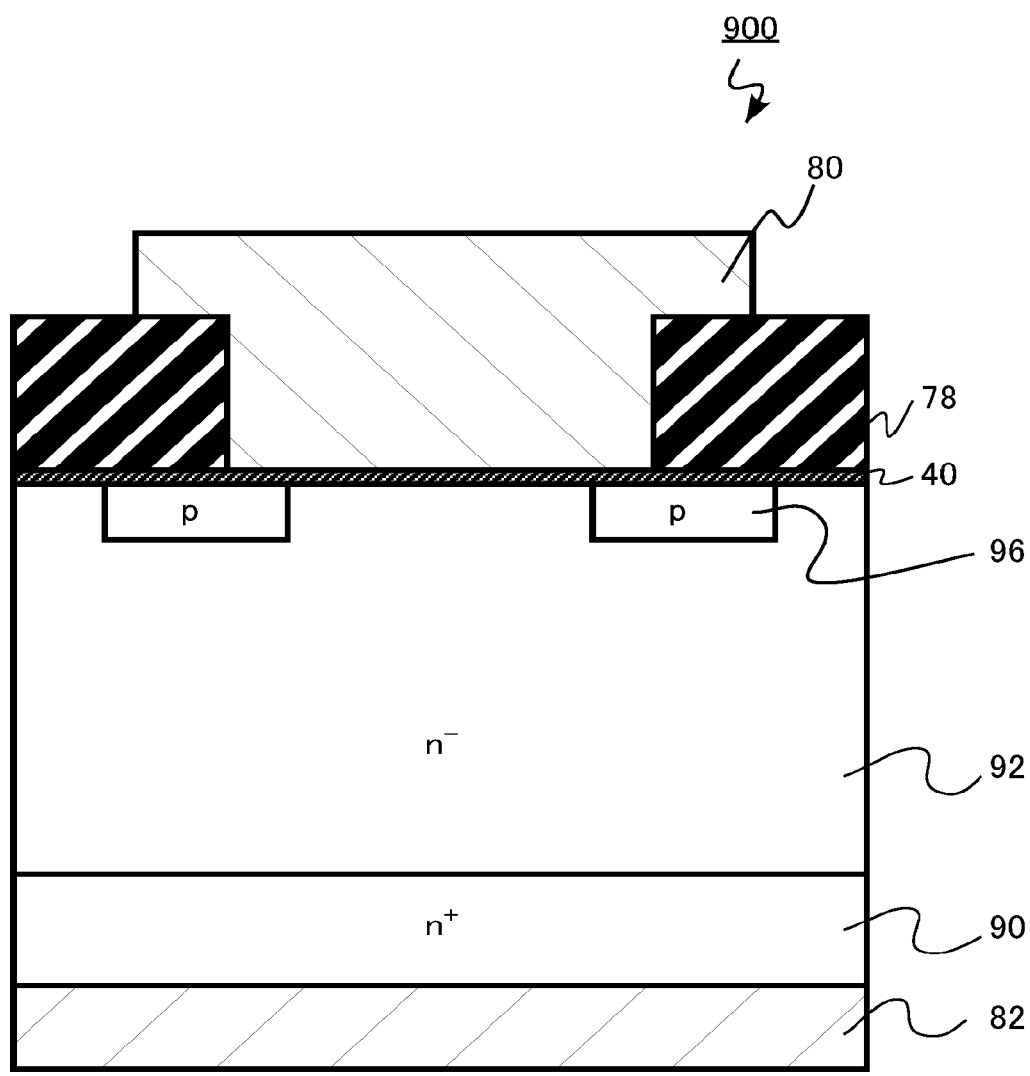
FIG. 22 is a schematic sectional view of a semiconductor device according to a fourteenth embodiment.

FIG. 22 is a schematic sectional view illustrating a configuration of an SBD which is the semiconductor device according to the present embodiment.

An SBD 900 includes an n+-type cathode region 90, an n−-type drift layer (diamond layer) 92, a p-type guard ring (diamond layer) 96, an interface region 40, a protection film (insulating layer) 78, an anode electrode (metal electrode) 80, and a cathode electrode 82.

The interface region 40 is provided among the guard ring 96, the drift layer 92, and the protection film 78. The interface region 40 is also provided between the drift layer 92 and the anode electrode 80.

The interface region 40 includes at least one element (termination element) selected from the group consisting of Be (beryllium), Mg (magnesium), Ca (calcium), Sr (strontium), and Ba (barium).

The termination element is segregated on an interface between the drift layer 92 and the anode electrode 80. A full width at half maximum of a concentration peak of the termination element is equal to or less than 1 nm. The full width at half maximum of the concentration peak is preferably equal to or less than 0.5 nm, and more preferably less than 0.2 nm.

The interface region 40 is preferably a monoatomic layer.

An area density of Si (silicon) and C (carbon) which do not bond with any of Si and C on a front face of the drift layer 72 is defined as a first area density. Further, an area density of a termination element is defined as a second area density. The second area density is equal to or less than ½ of the first area density.

The second area density is preferably equal to or less than 1/120 of the first area density. Further, the second area density is preferably equal to or greater than 1/12000 of the first area density.

A concentration peak of a termination element in the interface region 40 is preferably equal to or greater than $5 \times 10^{18}$ cm$^{-3}$. Further, the concentration peak is more preferably equal to or greater than $1 \times 10^{19}$ cm$^{-3}$.

The protection film 78 is, for example, a silicon oxide film.

If an interface state exists on an interface between the drift layer 92 and the anode electrode 80, fermi level pinning is caused. Therefore, a desired Schottky barrier may not be realized between the drift layer 92 and the anode electrode 80.

According to the present embodiment, an interface state is terminated by providing the interface region 40. Therefore, an SBD including a desired Schottky barrier determined by a work function of the anode electrode 80 is realized.

Further, as described above, it has been clarified that a termination element is further stabilized by bonding with C in comparison with Si. In the case where diamond is used as a semiconductor material, all of termination elements in the interface region 40 bond with C. Therefore, an SBD including the extremely stabilized interface region 40 is realized.

Variation of Fourteenth Embodiment

Figure 23:
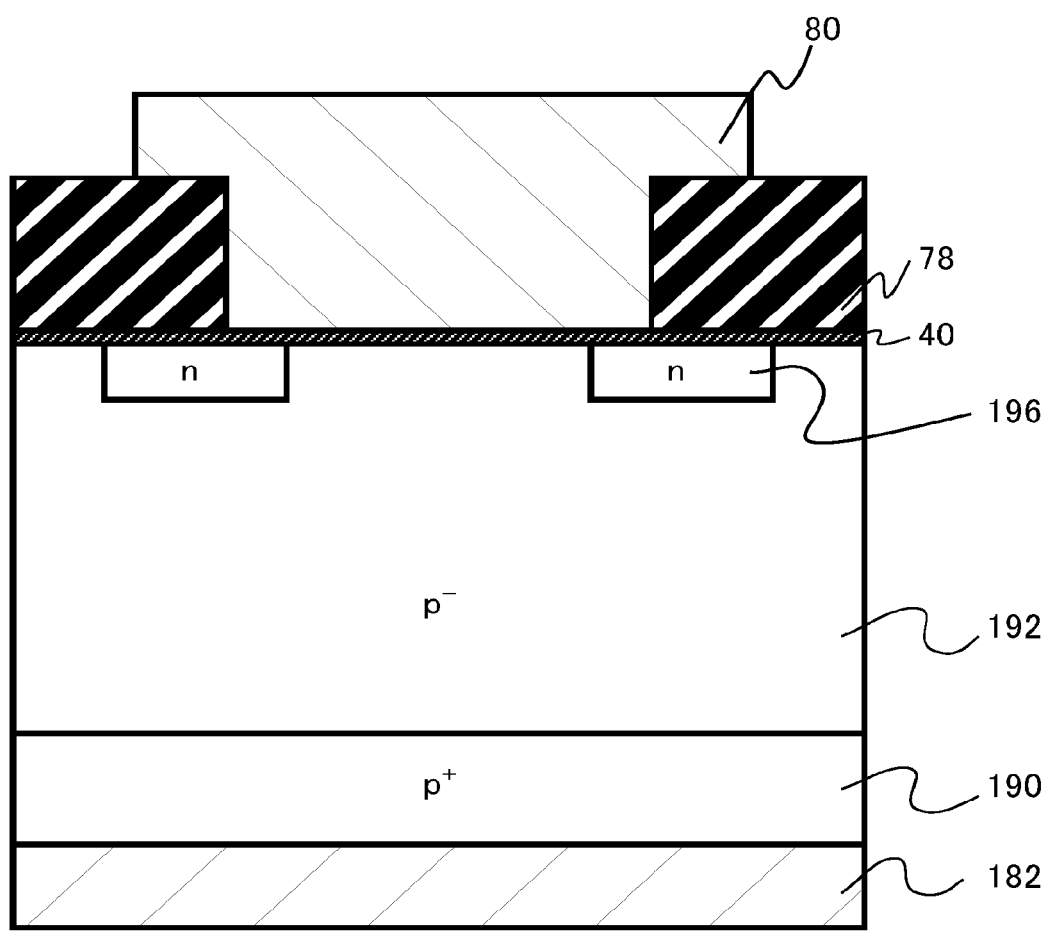
FIG. 23 is a schematic sectional view of a semiconductor device according to a variation of the fourteenth embodiment.

FIG. 23 is a schematic sectional diagram illustrating a configuration of an SBD which is a semiconductor device according to a variation of the present embodiment.

The SBD according to the variation includes a p+-type cathode region 190, a p−-type drift layer (diamond layer) 192, an n-type guard ring (diamond layer) 196, an interface region 40, a protection film (insulating layer) 78, an anode electrode 80, and a cathode electrode 82.

The interface region 40 is provided among the n-type guard ring 196, the p−-type drift layer 192, and the protection film 78.

The interface region 40 includes at least one element (termination element) selected from the group consisting of Be (beryllium), Mg (magnesium), Ca (calcium), Sr (strontium), and Ba (barium).

The SBD according to the variation is different from the SBD according to the present embodiment in terms in which an n-type and a p-type are inverted. According to the variation, an interface state is terminated by providing the interface region 40. Therefore, an SBD including a desired Schottky barrier determined by a work function of the anode electrode 80 is realized.

Fifteenth Embodiment

A semiconductor device according to a fifteenth embodiment includes a diamond layer including a first plane, an insulating layer, and a region provided between the first plane of the diamond layer and the insulating layer. The region includes at least one element selected from the group consisting of Be (beryllium), Mg (magnesium), Ca (calcium), Sr (strontium), and Ba (barium). In the region, a full width at half maximum of a concentration peak of the element is equal to or less than 1 nm, and in a case where an area density of C (carbon) which does not bond with any of C on the first plane is set to a first area density, a second area density which is an area density of the element is equal to or less than ½ of the first area density.

The fifteenth embodiment is similar to the tenth embodiment other than that diamond instead of SiC is used as a semiconductor material, and an n-type and a p-type are inverted. Therefore, description of contents described in the tenth embodiment will be omitted.

Figure 24:
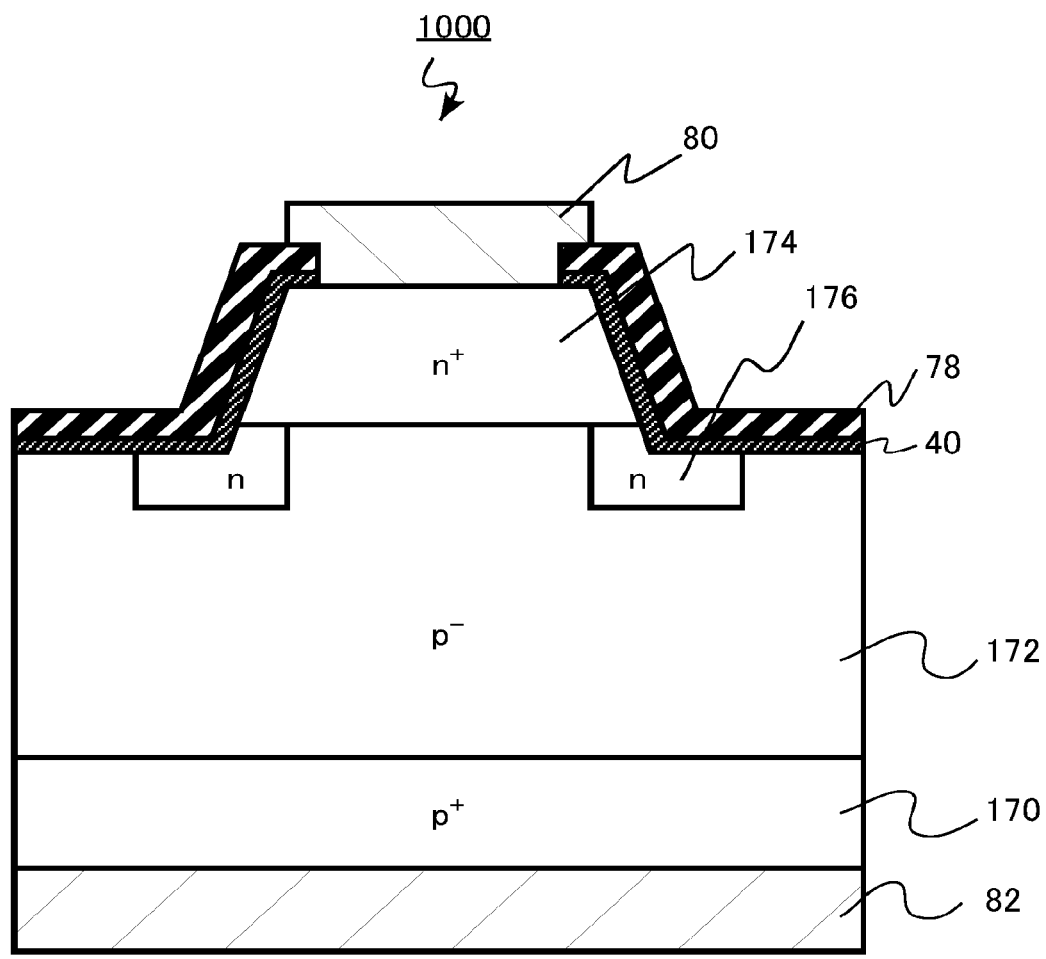
FIG. 24 is a schematic sectional view of a semiconductor device according to a fifteenth embodiment.

FIG. 24 is a schematic sectional view illustrating a configuration of a PIN diode which is a semiconductor device according to the present embodiment.

A PIN diode 1000 includes a p+-type cathode region 170, a p−-type drift layer (SiC layer) 172, an n+-type anode region 174, an n-type guard ring (SiC layer) 176, an interface region 40, a protection film (insulating layer) 78, an anode electrode 80, and a cathode electrode 82.

The interface region 40 is provided among the guard ring 76, the drift layer 72, and the protection film 78.

The interface region 40 includes at least one element (termination element) selected from the group consisting of Be (beryllium), Mg (magnesium), Ca (calcium), Sr (strontium), and Ba (barium).

According to the present embodiment, an interface state is terminated by providing the interface region 40. Therefore, a PIN diode is realized in which a desired depletion layer is formed, and a breakdown voltage is stabilized.

Further, as described above, it has been clarified that a termination element becomes more stable by bonding with C in comparison with Si. In the case where diamond is used as a semiconductor material, all of termination elements in the interface region 40 bond with C. Therefore, an SBD including the extremely stabilized interface region 40 is realized.

Sixteenth Embodiment

An inverter circuit and a driving device according to a sixteenth embodiment are a driving device which includes the semiconductor device according to the first embodiment.

Figure 25:
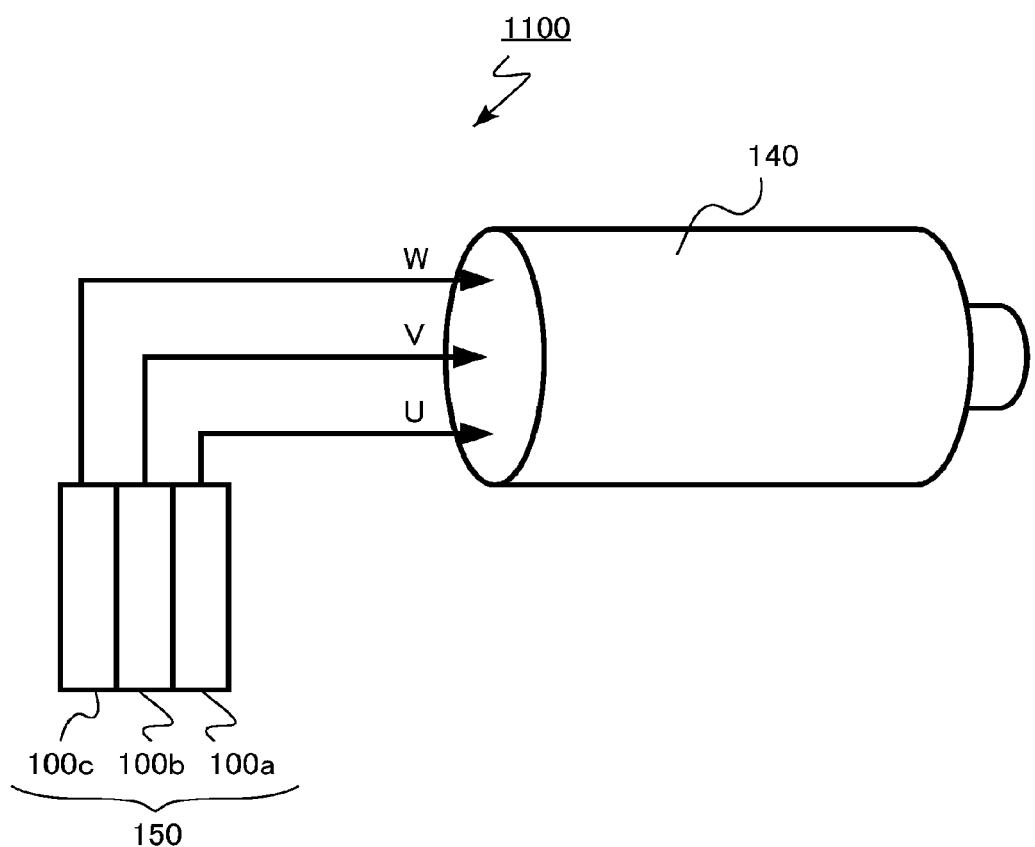
FIG. 25 is a schematic view of a driving device according to a sixteenth embodiment.

FIG. 25 is a schematic view of the driving device according to the sixteenth embodiment. A driving device 1100 includes a motor 140 and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 is realized which includes three AC voltage output terminals U, V, and W. The motor 140 is driven by an AC voltage output from the inverter circuit 150.

According to the present embodiment, operation of the inverter circuit 150 and the driving device 1100 are stabilized by including a MISFET 100 in which an interface state is decreased.

Seventeenth Embodiment

A vehicle according to a seventeenth embodiment is a vehicle including the semiconductor device according to the first embodiment.

Figure 26:
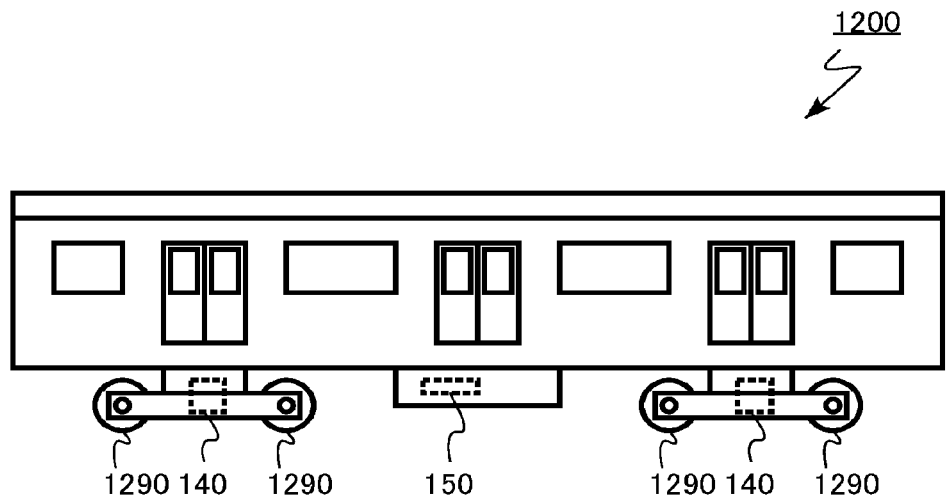
FIG. 26 is a schematic view of a vehicle according to a seventeenth embodiment.

FIG. 26 is a schematic view of the vehicle according to the seventeenth embodiment. A vehicle 1200 according to the present embodiment is a railroad vehicle. The vehicle 1200 includes a motor 140 and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 is realized which includes three AC voltage output terminals U, V, and W.

The motor 140 is driven by an AC voltage output from the inverter circuit 150. A wheel 1290 of the vehicle 1200 is rotated by the motor 140.

According to the present embodiment, operation of the vehicle 1200 is stabilized by including a MISFET 100 in which an interface state is decreased.

Eighteenth Embodiment

A vehicle according to a seventeenth embodiment is a vehicle including the semiconductor device according to the first embodiment.

Figure 27:
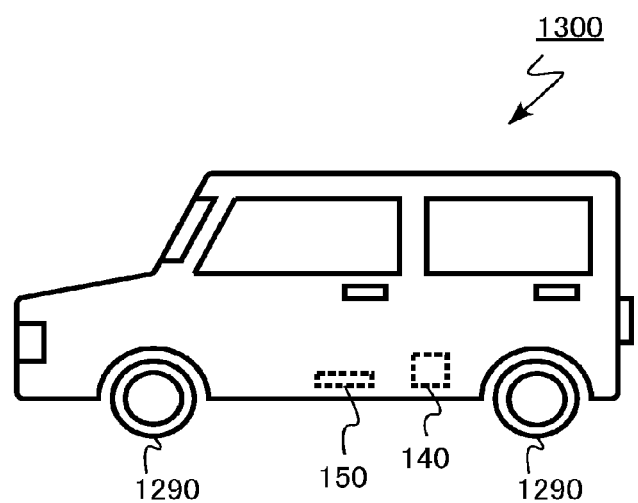
FIG. 27 is a schematic view of a vehicle according to an eighteenth embodiment.

FIG. 27 is a schematic view of the vehicle according to the eighteenth embodiment. A vehicle 1300 according to the present embodiment is an automobile. The vehicle 1300 includes a motor 140 and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 is realized which includes three AC voltage output terminals U, V, and W.

The motor 140 is driven by an AC voltage output from the inverter circuit 150. A wheel 1290 of the vehicle 1000 is rotated by the motor 140.

According to the present embodiment, reliability of the vehicle 1300 is improved by including a MISFET having a high threshold voltage.

Nineteenth Embodiment

An elevator according to a nineteenth embodiment is an elevator including the semiconductor device according to the first embodiment.

Figure 28:
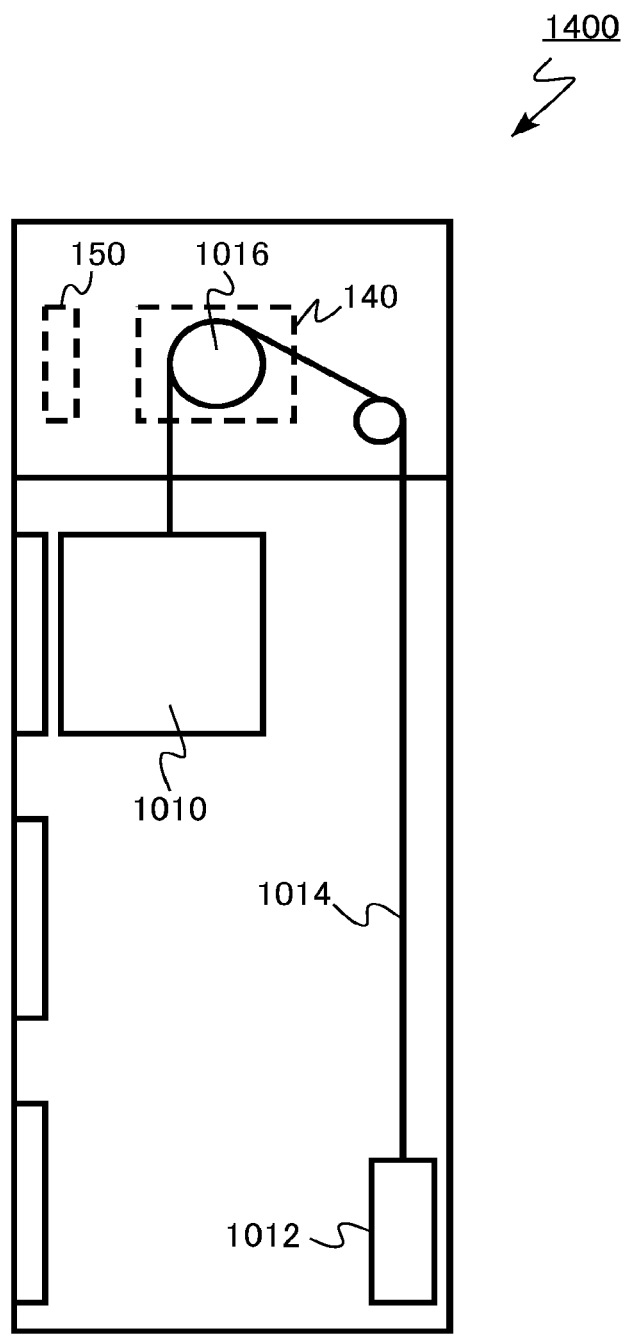
FIG. 28 is a schematic view of an elevator according to a nineteenth embodiment.

FIG. 28 is a schematic view of an elevator according to the nineteenth embodiment. An elevator 1400 according to the present embodiment includes an elevator car 1010, a counterweight 1012, a wire rope 1014, a hoisting machine 1016, a motor 140, and an inverter circuit 150.

An inverter circuit 150 includes three semiconductor modules 100a, 100b, and 100c in which the MISFET 100 according to the first embodiment is a switching element. The three semiconductor modules 100a, 100b, and 100c are connected in parallel. Accordingly, a three-phase inverter circuit 150 is realized which includes three AC voltage output terminals U, V, and W.

The motor 140 is driven by an AC voltage output from the inverter circuit 150. By the motor 140, the hoisting machine 1016 rotates, and the elevator car 1010 moves up and down.

According to the present embodiment, reliability of the elevator 1400 is improved by including a MISFET having a high threshold voltage.

In the first to twelfth embodiments, a device in which an n-type and a p-type are inverted also can improve characteristics thereof.

In the embodiments, an example in which a crystal structure of silicon carbide is 4H—SiC has been described above. However, the present disclosure can be applied to such as 6H—SiC, 3C—SiC, and silicon carbide of other crystal structure.

Further, in the seventeenth to nineteenth embodiments, an example has been described in which the semiconductor device according to the present disclosure is applied to a vehicle and an elevator. However, the semiconductor device according to the present disclosure can be applied, for example, to a power conditioner of a solar power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a SiC layer comprising a first plane;
   an insulating layer; and
   a region between the first plane and the insulating layer, the region comprising at least one element selected from the group consisting of Be (beryllium), Mg (magnesium), Cu (calcium) Sr (strontium) and Ba (barium), a full width at half maximum of a concentration peak of the element being equal to or less than 1 nm, and when a first area density being an area density of Si (silicon) and C (carbon) including a bond which does not bond with any of Si and C in the SiC layer at the first plane and a second area density being an area density of the element, the second area density being equal to or less than ½ of the first area density.

2. The semiconductor device according to claim 1, wherein the second area density is equal to or less than 1/120 of the first area density.

3. The semiconductor device according to claim 1, wherein the second area density is equal to or greater than 1/12000 of the first area density.

4. The semiconductor device according to claim 1, wherein a concentration of the element at the peak is equal to or greater than $5 \times 10^{18}$ cm$^{-3}$.

5. The semiconductor device according to claim 1, wherein a concentration of the element in the insulating layer is equal to or less than $1 \times 10^{18}$ cm$^{-3}$.

6. The semiconductor device according to claim 1, wherein the region is a monoatomic layer of the element.

7. The semiconductor device according to claim 1, wherein the first plane is a plane inclined at 0° or more and 30° or less with respect to a <0001> direction.

8. The semiconductor device according to claim 1, wherein the first plane is a plane inclined at 0° or more and 30° or less with respect to a (000-1) face.

9. The semiconductor device according to claim 1, further comprising a gate electrode on the insulating layer.

10. The semiconductor device according to claim 1, wherein the second area density is a value obtained by dividing an amount of the element in the region counted by a secondary ion mass spectrometry (SIMS) by a beam area of incident ions.

11. An inverter circuit, comprising the semiconductor device according to claim 1.

12. A driving device, comprising the semiconductor device according to claim 1.

13. A vehicle comprising the semiconductor device according to claim 1.

14. An elevator comprising the semiconductor device according to claim 1.

15. A semiconductor device, comprising:
   a SiC layer comprising a first plane;
   an insulating layer; and
   a region between the first plane and the insulating layer, the region comprising at least one element selected from the group consisting of Be (beryllium), Mg (magnesium), Ca (calcium), Sr (strontium), and Ba (barium), a full width at half maximum of a concentration peak of the element being equal to or less than 1 nm, and the element is divalent.

16. An inverter circuit, comprising the semiconductor device according to claim 15.

17. A driving device, comprising the semiconductor device according to claim 15.

18. A vehicle comprising the semiconductor device according to claim 15.

19. An elevator comprising the semiconductor device according to claim 15.

* * * * *